(12) United States Patent
Ikegami et al.

(10) Patent No.: US 6,720,522 B2
(45) Date of Patent: Apr. 13, 2004

(54) APPARATUS AND METHOD FOR LASER BEAM MACHINING, AND METHOD FOR MANUFACTURING SEMICONDUCTOR DEVICES USING LASER BEAM MACHINING

(75) Inventors: Hiroshi Ikegami, Kanagawa-ken (JP); Nobuo Hayasaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/983,683

(22) Filed: Oct. 25, 2001

(65) Prior Publication Data

US 2002/0050489 A1 May 2, 2002

(30) Foreign Application Priority Data

Oct. 26, 2000 (JP) .................................... P2000-326361
Jul. 13, 2001 (JP) .................................... P2001-213671

(51) Int. Cl.⁷ ............................................. B23K 26/00
(52) U.S. Cl. ........................ 219/121.69; 219/121.85
(58) Field of Search .................. 219/121.69, 121.85, 219/121.67, 121.68

(56) References Cited

U.S. PATENT DOCUMENTS

| 4,689,467 | A | * | 8/1987 | Inoue .................... 219/121 L |
| 5,057,184 | A | | 10/1991 | Gupta et al. |
| 6,407,385 | B1 | * | 6/2002 | Okada ........................ 250/306 |

FOREIGN PATENT DOCUMENTS

| EP | 1139415 | * | 10/2001 | ........... H01L/21/68 |
| JP | 08-220559 | | 8/1996 | |
| JP | 11-145108 | | 5/1999 | |
| WO | 01/75966 | * | 4/2001 | ........... H01L/21/78 |

* cited by examiner

Primary Examiner—M. Alexandra Elve
(74) Attorney, Agent, or Firm—Finnegan, Henderson, Farabow, Garrett & Dunner, L.L.P.

(57) ABSTRACT

In a laser beam machining method, a liquid, through which a laser beam can be transmitted, is supplied to the target surface of an object to be processed. A laser beam is guided to the target surface through the liquid. The laser beam processes the target surface under the application of ultrasonic vibration.

16 Claims, 20 Drawing Sheets

COMPARISON EXAMPLE

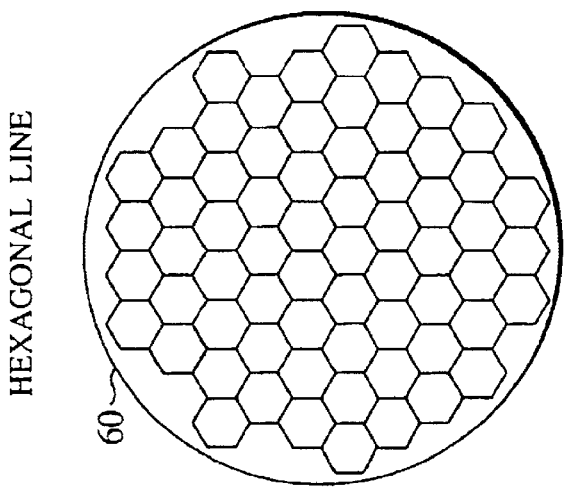
FIG.10A MATRIX LINE
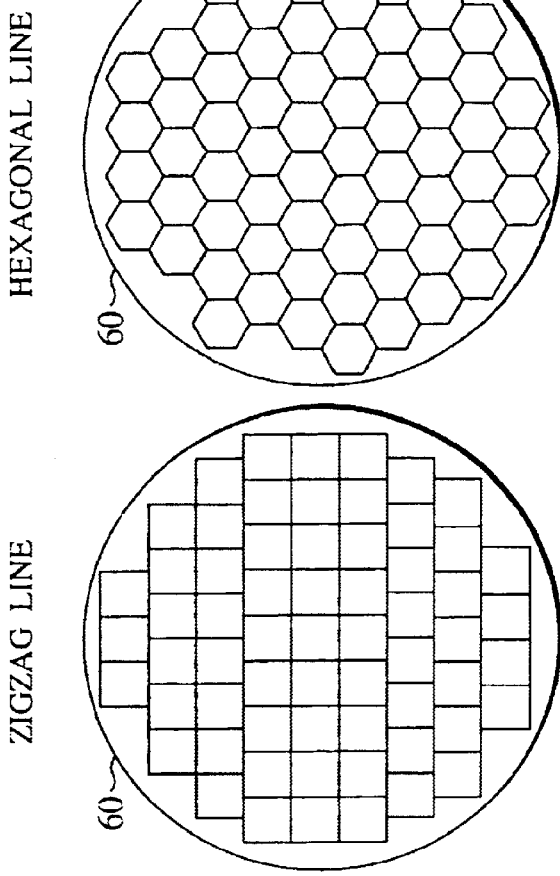
FIG.10B ZIGZAG LINE
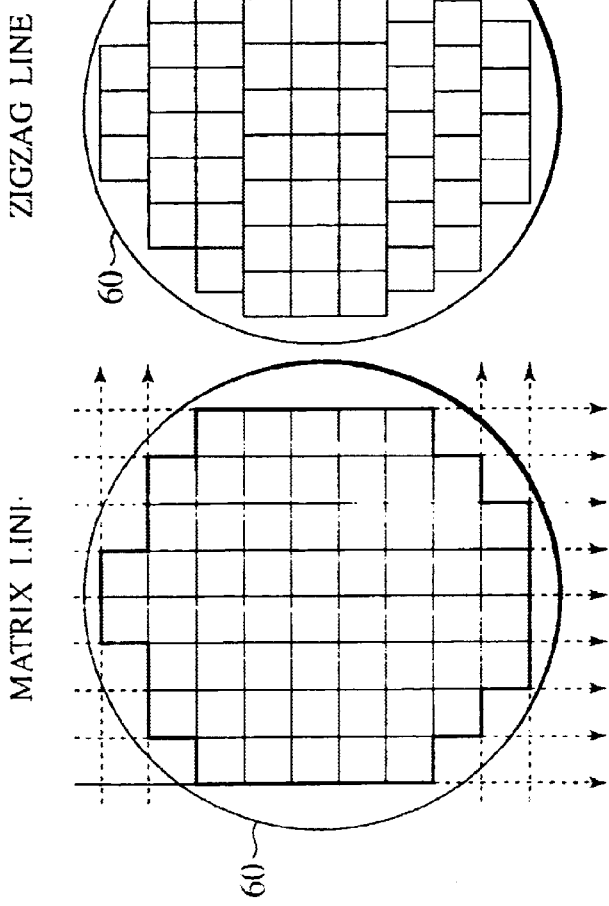
FIG.10C HEXAGONAL LINE

TOP VIEW

TOP VIEW

TOP VIEW

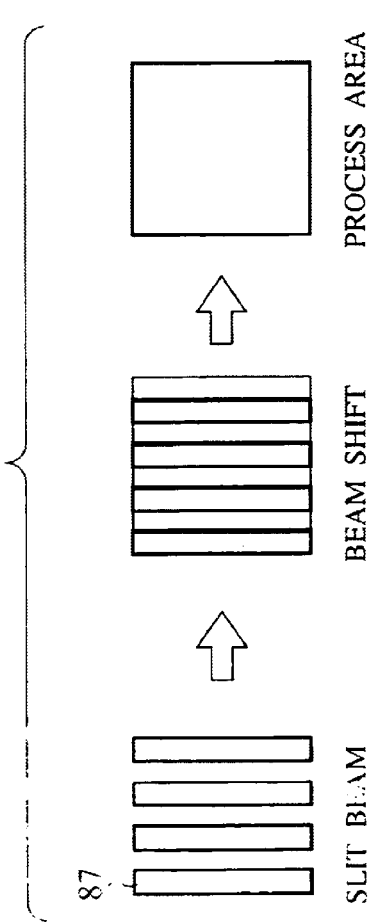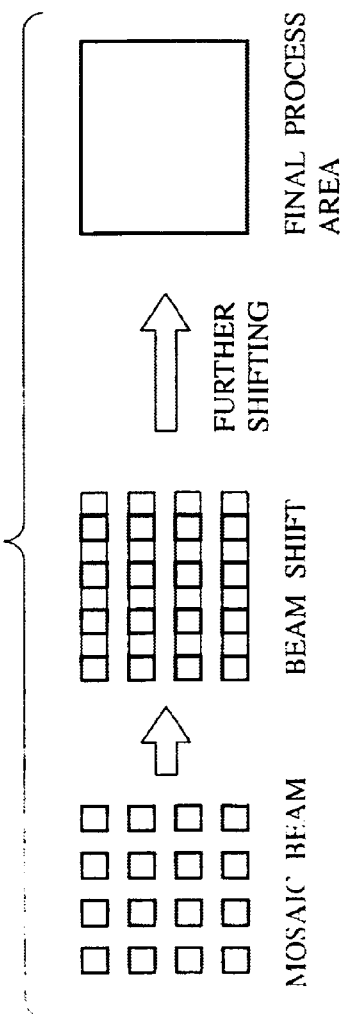

FIG.20A
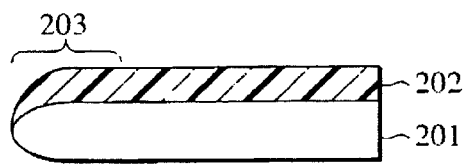
FIG.20B
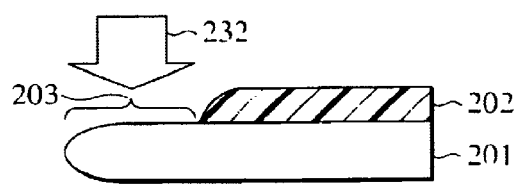
FIG.21A          FIG.21B          FIG.21C
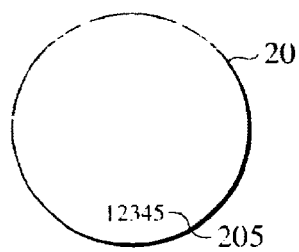   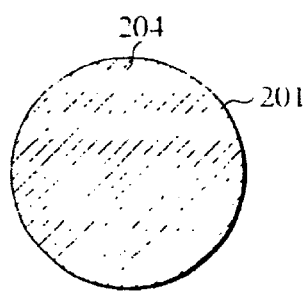   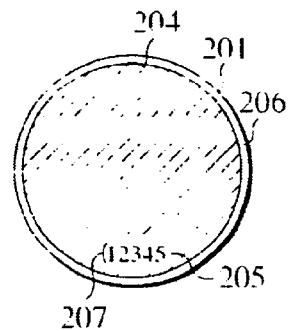

APPARATUS AND METHOD FOR LASER BEAM MACHINING, AND METHOD FOR MANUFACTURING SEMICONDUCTOR DEVICES USING LASER BEAM MACHINING

This patent application is based upon and claims the benefit of the earlier filing dates of Japanese Patent Application Nos. 2000-326361 and 2001-213671 filed Oct. 26, 2000 and Jul. 13, 2001, respectively, the entire contents of which are incorporated herein by reference.

BACKGROUND OF THE INVENTION

1. Field of the Invention

This invention relates to a technique of laser beam machining and a method for manufacturing semiconductor devices using the laser beam machining approach, and more substrates such as semiconductor wafers, glass substrates, or resin substrates, and thin films formed on these substrates.

2. Description of Related Art

Since laser beam machining is capable of delineating fine patterns of an order of a micron ($\mu$m) without requiring a lithography process, it has been attracting a great deal of attention as an approach to manufacturing semiconductor devices. In producing semiconductor devices, various types of layers, such as resist films, resin films, insulating films, metal films, etc. are formed and laminated on a wafer. Fine machining is needed not only for forming VIA holes, circuit patterns, and interconnections in the laminated layers, but also for selective removal of the laminated layers along the circumference of the wafer for the purpose of preventing dust from arising during wafer transfer, or revealing the manufacturer serial numbers formed in the wafers.

However, if laser beam machining is carried out in ordinary atmosphere, dust adheres to and accumulates on the processed areas. Adhesion of the dust causes poor exposure, short-circuit, and breakdown, which further causes the manufacture yield to drop.

Moreover, since laser beam machining makes use of ablation (i.e., removal of materials as a result of melting and evaporation), the laser beam that illuminates the substrate or the laminated layers of metals (e.g., aluminum alloy, copper, etc.), insulators ($SiO_2$, $Si_3N_4$, etc.), resins, etc. often causes damage to the irradiated regions and the area around them.

FIG. 1 illustrates examples of the damage caused by the conventional technique of laser beam machining. FIG. 1A shows damage to a silicon substrate, FIG. 1B shows damage to a metal layer, FIG. 1C shows damage to a $Si_3N_4$ film, and FIG. 1D shows damage to a photoresist.

As illustrated in FIG. 1A, a silicon single crystal wafer 1100 is machined in ordinary atmosphere using the fourth harmonic wave of a Q-switch Nd YAG laser, and the cross-sectional view of the machined area is observed by a transmission electron microscope (TEM). Polycrystalline silicon 1101 and void 1101A are formed around the machined area (or the irradiated area 1100), and many dislocation lines 1102 are observed.

Of these, it is thought that polycrystalline silicon 1101 and void 1101A are produced when melted silicon that has been fused by laser-beam irradiation solidifies. Moreover, since a steep temperature gradient is produced around the irradiated region 1110 by irradiation of the laser beam, a large amount of thermal stress accumulates even in domains in which the silicon single crystal wafer 1100 is not fused, and as a result, dislocation 1102 arises. With the deepening of the depth from the surface of the silicon single crystal wafer 1100, dislocation 1102 is apt to increase. At a depth of 200 $\mu$m, dislocation 1102 is observed over a wide area with a radius of about 100 micrometers from the center of the irradiated region 1110.

In addition, swelling 1103 of fused silicon arise from the top face of the silicon wafer 1100 around the irradiated area 1110, and silicon grains 1104 scattered by laser beam machining adhere to the swelling 1103 and around it.

This damage is observed even if the energy density of the laser beam is reduced to about 2.5 $J/cm^2$, which is the lower limit of laser-beam processing. Similar damage is observed even if a KrF excimer laser or its analogues are used to process the silicon substrate in ordinary atmosphere. Although machining lasers with a pulse width of several nanoseconds or greater, such as Q-switch Nd YAG lasers and KrF excimer lasers, are comparatively inexpensive and reliable in operation, the damage accompanying the irradiation of the leaser beam can not be avoided.

It is reported that using a laser beam with a very narrow pulse width of 1 picosecond or less can to some extent prevent fusion and the resultant thermal stress caused in a silicon wafer. Titanium sapphire laser is known as such a narrow-pulse laser with a pulse width of 1 psec or less. However, since titanium sapphire lasers are expensive, they are not suitable for processing semiconductor devices.

Moreover, voids 1101A and dislocations 1102 produced in the silicon single crystal substrate during laser beam machining lower the mechanical strength of the silicon wafer 1100, and induce further damage to the circuit elements or interconnects formed on the silicon wafer 1100. Swelling 1103 and scattered silicon grains 1104 will also induce degradation of the upper layers. These defects result in a reduced yield of semiconductor devices.

FIG. 1B is a cross-sectional view of a laser-processed thin metal film (copper, aluminum alloy, etc.) 1130 formed on the silicon single crystal substrate 1100 via a silicon oxidation film 1120. The thin metal film 1130 was machined in ordinary atmosphere using the fourth harmonic wave of a Q-switch Nd YAG layer. Similarly, FIGS. 1C and 1D illustrate a silicon nitride film 1150 and a photoresist film 1160, respectively, processed by the fourth harmonic wave of the Q-switch Nd YAG laser in ordinary atmosphere.

Swelling 1133 arises around the laser irradiation area 1110 on the thin metal film 1110, as in the silicon single crystal substrate 1100 shown in FIG. 1A. A large number of metal grains 1134 are scattered by the irradiation of the laser beam 1140, and they adhere to the swelling 1133 and its surrounding area. The height of the swelling 1133 is about 2 $\mu$m to 5 $\mu$m, and the diameter of the metal grain 1134 reaches several micrometers. The swelling 1133 and the metal grains 134 deteriorate the reliability of the upper layers, and cause the yield of semiconductor devices to fall.

If the thin metal film 1130 is a cupper film, it is found by scanning micro-auger ($\mu$-AES) analysis that carbon (C) contamination 1135 has occurred around the laser-beam irradiation area 1110. Such carbon contamination is conspicuous at the swelling 1133, and the carbon contents reaches as much as a several tens percentage. Generally, the thin metal film 1130 is patterned into interconnections or electrodes. Carbon contamination 1135 partially increases the resistance of the interconnections and the electrodes, and designed circuit characteristics cannot be obtained. These defects also result in the decreased manufacture yield of semiconductor devices.

Swelling and scattered grains are also observed in the silicon nitride film 1150 and the photoresist film 1160. After the silicon nitride film 1150 is laser-beam machined in ordinary atmosphere, swelling 1153 arises around the laser-beam irradiation area 1110, and a large number of silicon nitride grain 1154 adhere to the swelling 1153. Similarly, if laser beam machining is conducted to the photoresist film 1160 in ordinary atmosphere, swelling 1163 and a large number of photoresist grains 1164 that have adhered to the machined surface are observed.

Since the silicon nitride grains 1154 and the photoresist grains 1164 are small compared with the metal grains 1134, these particles scatter over hundreds of micrometers around the laser-beam irradiation area 1110. The widely spread silicon nitride grains 1154 adversely affect the upper thin films formed on the silicon nitride film 1160. The scattered photoresist grains 1164 induce poor exposure and poor development in the photolithography process. In any cases, the manufacturing yield is reduced.

SUMMARY OF THE INVENTION

In one aspect of the invention, a laser beam machining method is provided, which includes (1) supplying a liquid, through which a laser beam can be transmitted, to a target surface of an object to be processed, (2) guiding a laser beam to the target surface through the liquid, and (3) procesing the target surface by the laser beam under the application of ultrasonic vibration.

In another aspect of the invention, a laser beam machining apparatus is provided which includes a laser oscillator, a holder configured to hold an object to be processed, an optical system configured to guide a laser beam emitted from the laser oscillator to a target surface of the object, and a liquid supplier for configured to supply a liquid to the target surface of the object. The holder has an inlet port and an outlet port located so as to substantially align with the target surface of the object.

In still another aspect of the invention, a laser beam machining apparatus includes a laser oscillator, a holder configured to hold an object to be processed, an optical system configured to guide a laser beam emitted from the laser oscillator to a target surface of the object, a liquid supplier configured to supply a liquid to the target surface, and a rotation mechanism configured to rotate the object.

In yet another aspect of the invention, a method for manufacturing a semiconductor device using laser beam machining is provided. This method includes (1) forming a film above a substrate, (2) supplying a liquid, through which a laser beam can be transmitted, to a target surface of the film, and (3) guiding a laser beam to the target surface through the liquid, and patterning the film into a predetermined shape by the laser beam, while applying ultrasonic vibration to the target surface.

In yet another aspect of the invention, a method for manufacturing a semiconductor device includes (1) forming a film above a substrate, (2) supplying a liquid, through which a laser beam can be transmitted, to a target surface of the film, and (3) guiding a laser beam to the target surface through the liquid, and selectively removing the film along a periphery of the object by the laser beam, while rotating the object.

In yet another aspect of the invention, a method for manufacturing a semiconductor device includes (1) forming a film above a substrate, (2) supplying a liquid, through which a laser beam can be transmitted, to a target surface of the film, and (3) guiding a laser beam to the target surface through the liquid and processing the film under the condition of $Ti \geq 0.3/\alpha i$, where $\alpha i$ is the laser-absorption coefficient of the film, and $Ti$ is the thickness of the film.

In yet another aspect of the invention, a method for manufacturing a semiconductor device includes (1) forming a resist film above a wafer via an antireflection film, (2) supplying a liquid, through which a laser beam to be transmitted to a target surface of the resist film, and (3) guiding a narrow laser beam to the target surface through the liquid, and scanning the laser beam on the target surface to remove a predetermined area of the resist film and the antireflection film.

BRIEF DESCRIPTION OF THE DRAWINGS

FIG. 4 illustrates an application of laser beam machining to a silicon wafer according to the third embodiment of the invention, in which

FIG. 8 illustrates another application of laser beam machining, in which

FIG. 10 illustrates examples of optimization of chip arrangement by forming desired dicing lines on a wafer using laser beam machining.

FIG. 15 illustrates examples of slit profile of the scanned laser beam.

FIG. 20 illustrates an application of laser beam machining to removal of the circumferential area of a wafer.

FIG. 21 illustrates an application of laser beam machining to revealing the manufacturing serial number formed in a wafer.

DETAILED DESCRIPTION OF EMBODIMENTS

Figure 1A:
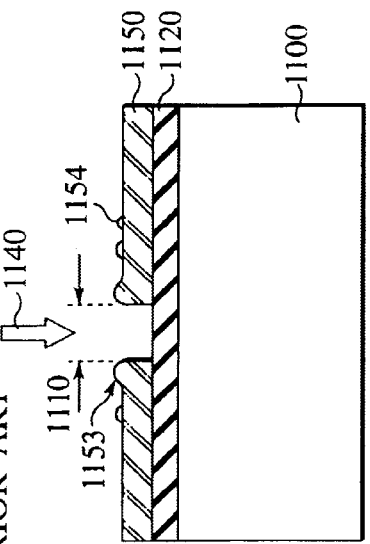
FIG. 1 illustrates damage produced by a conventional laser beam machining technique.

The invention will now be described in detail based on several embodiments, with reference to the attached drawings. In the drawings, the same or the similar numerical references denote the same or the similar parts. The drawings are schematic illustrations, and the dimensional relationship between the thickness and the area, and the ratio of the thickness of the respective layers may differ from reality for the sake of explanation. In addition, the expression "on the substrate (or the layer)" simply indicates the relative positional relationship with respect to the surface of the substrate (or the layer), regardless of the existence of intermediate layers.

(First Embodiment)

Figure 2:
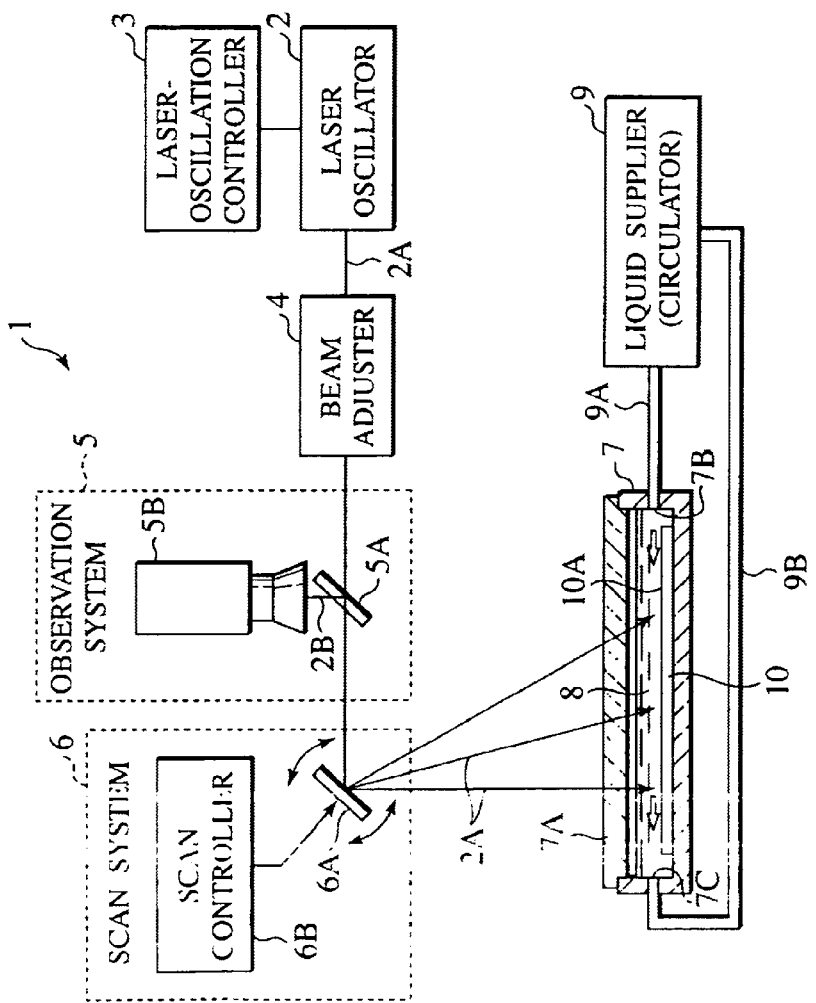
FIG. 2 schematically illustrates the structure of a laser beam machining apparatus according to the first embodiment of the invention.

FIG. 2 illustrates a laser beam machining apparatus 1 according to the first embodiment of the invention. The laser beam machining apparatus 1 includes a laser oscillator 2, a holder 8 for holding an object 10 that is to be processed, a scanning system 6 for scanning the laser beam 2A emitted from the laser oscillator 2 on a target surface 10A of the object 10, and a liquid supplier 9 for supplying a liquid into the holder 6 (more particularly, to the target surface 10A). The holder 6 has an inlet port 7B and an outlet port 7C positioned so as to align with the target surface 10A of the object 10. In the following explanation, a silicon single crystal wafer 10 is used as an example of the object 10.

The laser beam machining apparatus 1 also includes a laser-oscillation controller 3, a beam adjuster 4, and an observation system 5 for observing the irradiation spot on the wafer 10.

The laser oscillator 2 is, for example, Q-switch Nd YAG laser, and it is capable of generating a laser beam 2A having a fundamental vibration (wavelength of 1064 nm), second harmonics (wavelength of 532 nm), third harmonics (wavelength of 355 nm), or fourth harmonics (wavelength of 266 nm).

The pulse width of laser beam 2A emitted from the laser oscillator 2 is set to about 10 ns, and the irradiation area can be adjusted by a slit adjusting mechanism (not shown) in a range from 10 $\mu$m×10 $\mu$m to 500 $\mu$m×500 $\mu$m. The oscillation frequency of the laser oscillator 2 is set to 10 kHz. A laser-oscillation controller 3 controls the oscillation timing and the irradiation area of the laser beam 2A.

The laser beam 2A emitted from the laser-oscillator 2 passes through the beam adjuster 4, the observation system 5, and the scanning system 6 one by one, and is guided to the target surface 10A of the wafer 10. The beam adjuster 4 includes a beam shaper (not shown) for adjusting the beam profile, and a projection lenses (not shown) for projecting the shaped beam 2A. The observation system 5 includes a half mirror 5A, which extracts the light component 2B from the optical axis, and an observation camera 5B, which observes the laser beam 2B extracted by the half mirror 5A. The observation system 5 also includes an illumination light source, such as a halide lamp, to allow the image of the laser irradiation area on the target surface to be observed. Using the observation system 5, the position of the laser irradiation is appropriately aligned.

The scanning system 6 includes a scanning mirror 6A and a scan controller 6B that controls the scanning mirror 6A so as to continuously scan the laser beam 2A or shift the irradiation position of the laser beam 2A on the target surface 10A of the wafer 10. Although, in the example shown in FIG. 2A, the irradiation position of the laser beam 2A on the wafer 10 is controlled by the scanning system 6, the holder 7 may be equipped with a driving controller, which drives the holder 7 in horizontal and vertical directions (i.e., x, y, and z directions) to vary the irradiation position of the laser beam 2A on the wafer 10.

The holder 7 is configured like a tray to receive the wafer 10. The shape of the holder 7 may be suitably changed according to the shape of the object that is to be processed. If a disk object, such as semiconductor wafer, is processed, a round holder 7 is used. If processing a rectangular object, such as a quartz glass substrate used in a liquid crystal display or a printed-circuit board, a rectangular holder 7 is preferably used. Of course, a rectangular holder 7 may be used to hold a round wafer 10.

In the example shown in FIG. 2, the holder 7 is set horizontally, and therefore, the inlet port 7B and the outlet port 7C of the holder 7 are positioned at substantially the same height as the target surface 10A of the wafer 10. Of course, the wafer 7 need not necessarily be held horizontally. Even if the holder 7 is tilted at an angle, the inlet port 7B and the outlet port 7C of the holder 7 align with the target surface 10A of the wafer 10. Preferably, the inlet port 7B and the outlet port 7C are positioned on opposite sides of the wafer 10, so that the liquid 8 supplied from the liquid supplier 9 constantly flows on the target surface 10A of the wafer 10 in a substantially uniform flow, without turbulence. This arrangement efficiently prevents air bubbles and dust (or the particles) produced by the irradiation of the laser beam from adhering to the machined surface of the entire area of the wafer 10.

The holder 7 also has a transparent aperture 7A, which covers the target surface 10a and the liquid flowing on the target surface 10A, while allowing the laser beam 2A to penetrate. Accordingly, the laser beam 2A penetrates the aperture 7A and the liquid 8, and reaches the target surface 10A of the wafer 10. The aperture 7A prevents the liquid 8 that flows on the wafer 10 from splashing.

Any kind of liquid may be used as the liquid 8. Preferably, those that can absorb the heat generated by the laser beam in and near the irradiation area, and that can suppress the extent of vapor and bubbles generated by the irradiation of the beam are suitably used. In the embodiments, pure water, an aqueous ammonia solution, glycine hydrogen peroxide solution, etc. are practically used as the liquid 8, as will be described later.

Pure water is applicable to processing of most materials. An aqueous ammonia solution can accelerate the laser-beam machining rate, compared with pure water, if the target material is silicon. Glycine hydrogen peroxide solution has characteristics that promote the etching rate with respect to copper (Cu) as the temperature rises, and accordingly, copper interconnections can be efficiently patterned making use of the natural temperature rise due to the irradiation of the laser beam.

The liquid supplier 9 supplies the liquid 8 to the holder 7 so that the target surface 10A of the wafer 10 is covered with the liquid 8. However, in order to remove the heat and suppress the influence of the vapor more efficiently, the entirety of the wafer 10 may be immersed in the liquid 8.

The liquid supplier 9 is, for example, a circulation pump coupled to the holder 7 via the inlet tube 9A and the outlet tube 9B. If a circulation pump is used as the liquid supplier 9, the pump is equipped with a filter (not shown) to remove dust and particles produced in the machining process.

The liquid 8 may be drained without being circulated as long as the liquid 8 moves in a constant direction in a substantially uniform flow on the target surface 10A, without causing turbulence. Such a uniform flow allows the air bubbles and dust produced in the irradiation area to be continuously removed. Since, in the arrangement shown in FIG. 2, the inlet port 7B and the outlet port 7B are positioned substantially aligned with the target surface 10A, the liquid 8 is supplied from the liquid supplier 9 at a constant mass flow, and moves on the target surface 10A in a uniform direction without causing undesirable fluctuation in the laser beam 2A.

In a laser beam machining method using the apparatus shown in FIG. 2, a liquid is supplied to the target surface 10A of an object 10, and a laser beam is guided to a predetermined location on the target surface 10A, passing through the liquid flowing on the target surface 10A. Finally, the laser beam processes the target surface 10A.

By carrying out laser beam machining through the flowing liquid, the air bubbles and dust produced in the laser irradiation area are continuously removed. It is desirable that the liquid makes a substantially uniform flow in a constant direction in order to prevent turbulence on the target surface and fluctuation in the laser beam penetrating the liquid.

Since, with the laser beam machining approach according to the first embodiment, the heat generated in the irradiation area is absorbed in the liquid flowing on the target surface, damage to the laser irradiation area can be reduced. Especially, when processing a silicon single crystal substrate, a compound semiconductor substrate, an insulator, or a conductor, the spread of the heat due to the irradiation, and resultant crystal defects can be effectively inhibited. In addition, particle and dust scattered by the laser machining are prevented from adhering to the machined surface.

(Second Embodiment)

Figure 3:
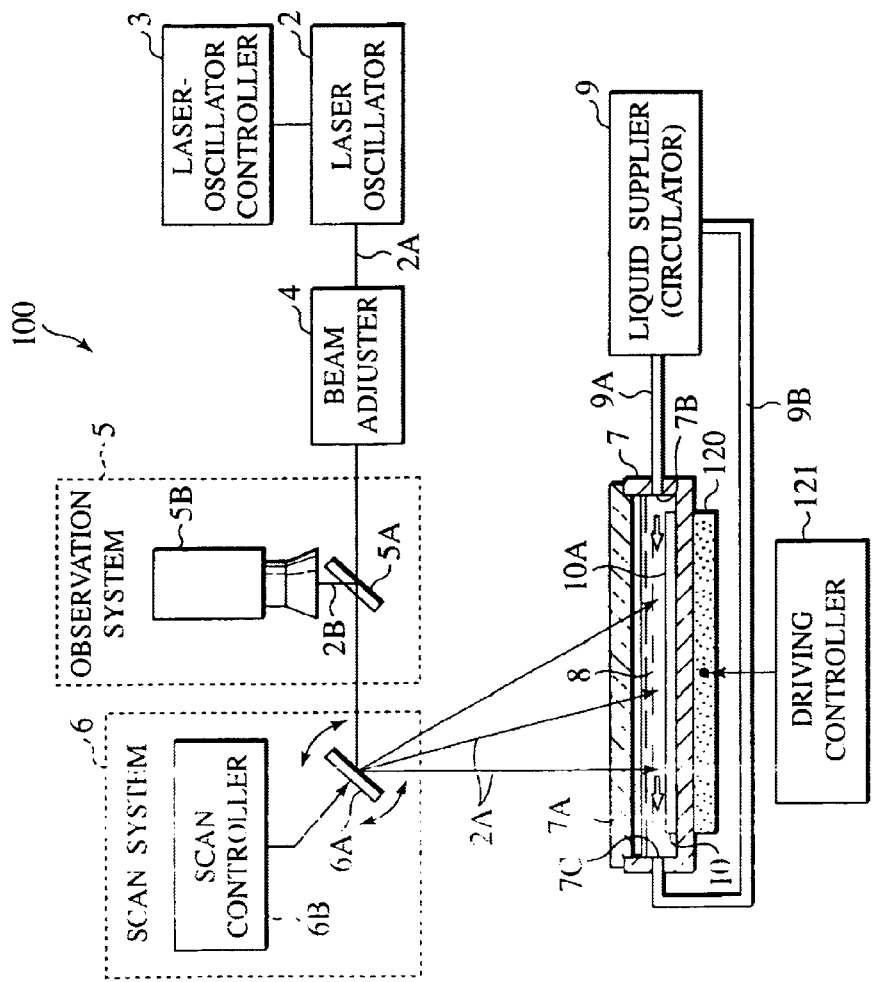
FIG. 3 schematically illustrates the structure of a laser beam machining apparatus according to the second embodiment of the invention.

FIG. 3 illustrates a laser beam machining apparatus 100 according to the second embodiment of the invention. The laser beam machining apparatus 100 comprises a laser oscillator 2, a holder 7 that holds the object to be processed (for example, a wafer) 10, a scanning system 6 for scanning a laser beam 2A emitted from the laser oscillator 2 on a target surface 10A of a wafer 10, a liquid supplier 9 for supplying a liquid 8 to the holder 7, and a ultrasonic application mechanism for providing a ultrasonic vibration to the target surface 10A of the wafer 10.

In the example of FIG. 3, the ultrasonic application mechanism is comprised of a piezoelectric element 120 attached to the rear face of the holder 7, and a driving controller 121 for controlling the motion of the piezoelectric element 120. Ultrasonic vibration propagates from the piezoelectric element 120 to the wafer 10 via the holder 7, and consequently, the target surface 10A of the wafer 10 vibrates ultrasonically.

Although not shown in the figure, the ultrasonic application mechanism may be provided to the liquid inlet tube 9A that connects the liquid supplier 9 to the holder 7. In such a case, ultrasonic vibration is applied to the liquid 8, and when the liquid 8 flows on the target surface 10A of the wafer 10, the ultrasonic vibration propagates to the target surface 10A.

The holder 7 has a transparent aperture 7A, an inlet port 7B and an outlet port 7C as in the first embodiment. The inlet port 7B and the outlet port 7C are positioned so as to substantially align with the target surface 10A. In other words, if the holder 7 is set horizontally, the inlet port 7B and the outlet port 7C are located at substantially the same height as the target surface 10A. The transparent aperture 7A allows the laser beam 2A to pass through.

The Laser beam machining apparatus 100 further includes a laser-oscillation controller 3, which controls the oscillation timing and other factors of the laser oscillator 2, a beam adjuster 4, and an observation system 5 for observing the irradiation location on the wafer 10. The beam adjuster 4 includes a beam shaper (not shown) for adjusting the beam profile, and a projection lenses (not shown) for projecting the shaped beam.

In a laser beam machining method using the apparatus shown in FIG. 3, a liquid that allows a laser beam to be transmitted is supplied to an object (e.g., a wafer) to be processed, and a laser beam is guided to the target surface of the wafer, passing through the liquid to irradiate the target surface. During the irradiation, ultrasonic vibration is applied to the target surface.

Ultrasonic vibration is applied, for example, to the bottom lace (i.e., the opposite face to the target surface) of the wafer 10 so that the vibration propagates to the target surface 10A. Alternatively, ultrasonic vibration may be applied to the liquid 8 in advance, and the ultrasonically vibrating liquid 8 applies vibration to the target surface 10A. Ultrasonic vibration may be applied only to the irradiation area, or alternatively, it may be applied to the entire area of the target surface 10A.

With this laser beam machining approach, the target surface vibrates during laser beam processing. Accordingly, the dust and the air bubbles produced during the machining are washed away from the target surface. Even if dust or particles have adhered to the machined surface, they are shaken off the surface. In this manner, fine and precise processing is realized by efficiently removing undesirable dust and air bubbles through the application of ultrasonic vibrations, in addition to supplying a uniformly flowing liquid to the target surface.

(Third Embodiment)

Various applications of the laser beam machining approach introduced in the first and second embodiments to a manufacturing process of semiconductor devices will now be described.

(1) Laser Beam Machining of a Semiconductor Substrate

FIG. 4 illustrates an example of forming a trench 11T in a semiconductor substrate (e.g., a silicon single crystal wafer) 11 using the laser beam machining approach of the first or second embodiment.

Laser beam machining is desired as an efficient dicing technique for cutting a wafer into chips, in place of a blade or a wire saw. As layers become thinner and thinner and the pattern on a semiconductor chip becomes finer and finer, a so-called first dicing technique is efficiently used to cut a semiconductor wafer into chips. With the first dicing technique, a groove that reaches halfway through the wafer is formed from the patterned surface of the wafer, and then, the wafer is polished from the bottom face until the half-cut groove is exposed, thereby separating the wafer into chips.

Figure 4A:
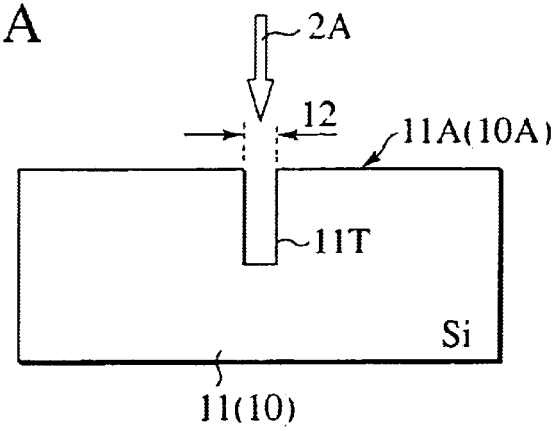
FIG. 4A shows laser beam machining while supplying pure water.

To be more precise, as shown in FIG. 4A, a laser beam 2A is guided to the target surface 11A of the wafer 11, while supplying a liquid (not shown) to the target surface 11A but avoiding turbulence. A trench 11T having a width of about 10 μm and a depth of about 50 μm is formed by the laser irradiation through the liquid. Ultrasonic vibration may be applied to the target surface 11A during the irradiation (or machining). In such a case, dust and air bubbles that accompany the laser irradiation are removed more efficiently.

The profile of the laser beam 2A is a rectangle of 10 μm×500 μm. The irradiation energy density per pulse is 4 J/cm$^2$, and the oscillation frequency is 10 kHz. By scanning the laser beam 2A at 10 mm/sec in the longitudinal direction of beam profile, a dicing line is formed in the target surface 11A. In this case, the wavelength of the laser beam 2A is 266 nm and the pulse width is 10 ns. Pure water, as the liquid 8, introduced onto the target surface 11A of the wafer 11. Preferably, the pure water is circulated through the inlet tube 9A and the outlet tube 9B, as shown in FIG. 2, and is controlled so as to flow across the target surface 11A at a constant rate in a uniform direction. If ultrasonic vibration is applied to the target surface 11A using the apparatus shown in FIG. 3, the dust and the scattered particles are prevented from adhering to the target surface 11A still more efficiently.

The observation result using a TEM shows that damage, such as cracks and dislocation, have not occurred in the laser irradiation area 12 and its surroundings. In addition, undesirable voids 1101A, polycrystalline silicon 1101, swelling 1103, and silicon grains 1104 (FIG. 1A) were not observed, unlike conventional laser beam machining in ordinary atmosphere.

In the laser beam machining of the example, fourth harmonics (with a wavelength of 266 nm) is used as the laser beam 2A. However, use of a fundamental wave With a wavelength of 1064 nm, second harmonics with a wavelength of 355 nm, or third harmonics with a wavelength of 532 nm can also achieve the same effect, that is, prevent the damage and adhesion of the scattered particles to the machined area. For example, if a fundamental wave is used, the irradiation energy density is raised to 20 J/cm$^2$, which is about 5 times as large as that of the fourth harmonics to machine the target surface at the same precision.

In the example shown in FIG. 4A, laser beam machining is applied to dice the silicon single crystal wafer 11 into chips by forming a dicing trench 11T. This dicing technique using a laser beam is also applicable to separation of light emitting diodes and semiconductor laser diodes, which are made of a compound of Ga, P, As, In, Al, and the like.

Figure 4B:
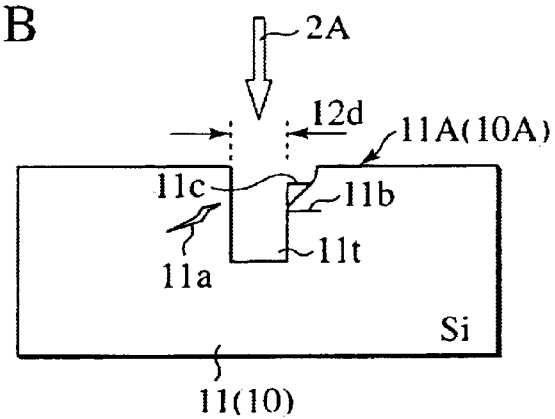
FIG. 4B shows a comparison example of laser beam machining in ordinary atmosphere.

FIG. 4B shows a comparative example of the first dicing process using a blade 13. Usually, a blade 13 with a width of 30 μm to 40 μm is used for dicing, and such a blade 13 is capable of forming a trench with a depth of 50 μm to 100 μm. However, if a trench of 50 μm depth is formed by a blade 13 in the wafer 11, mechanical stress occurs. Mechanical stress causes the occurrence of crack 11a and dislocation 11b inside the wafer 11 along the machined area, and it also causes chipping 11c near the surface of the wafer 11. The damage due to the blade dicing spreads as wide as 100 μm along the dicing line. Accordingly, circuit elements, such as transistors, resistances, and capacitors, can not be arranged within 100 μm from the dicing line. Furthermore, such crack 11a and chipping 11c will reduce the mechanical strength of the semiconductor chip after the dicing.

Figure 4C:
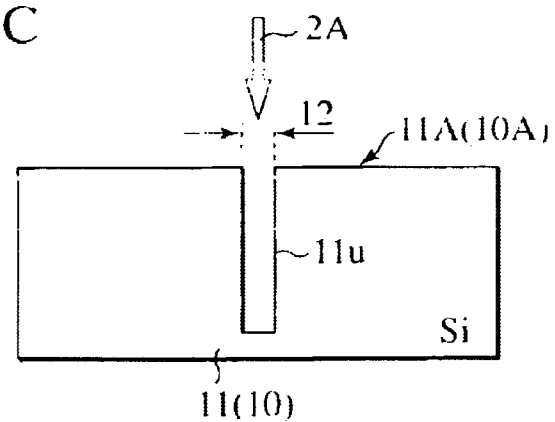
FIG. 4C shows laser beam machining while supplying ammonia water.

FIG. 4C shows an example of laser beam machining, while supplying aqueous ammonia solution (not shown) to the target surface 11A of the silicon wafer 11. The conditions for laser beam machining through the aqueous ammonia solution are the same as those in the previous example using pure water. That is, the cross section of the laser beam 2A is 10 μm×500 μm, the beam-scanning speed is 10 mm/sec, the oscillation frequency is 10 kHz, the irradiation energy density is 4J/cm$^2$ per pulse, and the wavelength is 266 nm. Under these conditions, a trench U is formed in the target surface 11A.

The observation result using a TEM exhibits that the trench 11 U formed while supplying aqueous ammonia solution reaches as deep as 100 μm. In comparison with the laser beam machining using pure water which defines a trench with a depth of 50 μm under the same irradiation conditions, the depth of the trench is double.

In addition, little damage, such as crack 11a, 4B, transition 11b, or chipping 11c shown in FIG. 4B, or as void 1101A, dislocation 1102, or swelling 1103 shown in FIG. 1A, was observed. An excellent machining profile is maintained, without the adhesion of dust or silicon grains to around the irradiation area 12.

When the beam-scanning speed was set to 20 mm/sec, instead of 10 mm/sec, while supplying an aqueous ammonia solution, a trench 11 U with a depth of 50 μm was formed while the rest of the conditions were maintained. In other words, by using an aqueous ammonia solution as the liquid 8, double the machining rate can be achieved. Consequently, the processing time can be greatly reduced.

If ultrasonic vibration is applied to the target surface 11A, while supplying the ammonia solution, the adhesion of scattered particles, such as silicon grains, is more effectively prevented.

Figure 5:
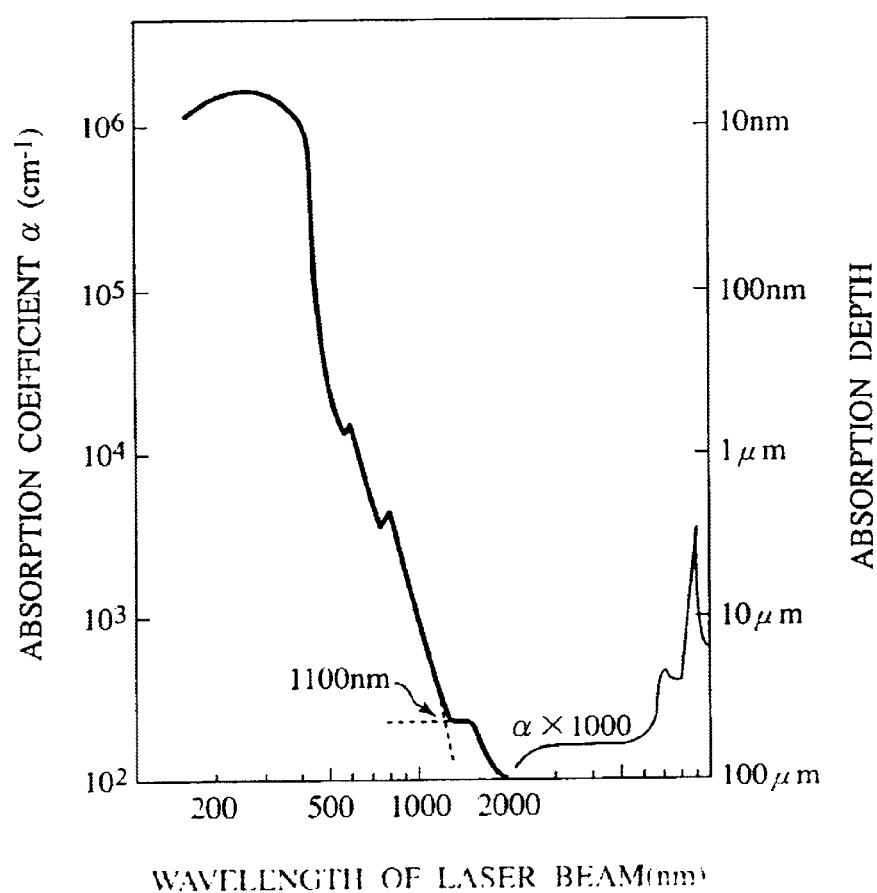
FIG. 5 illustrates the absorption coefficient and the absorption depth of silicon with respect to a laser beam, as a function of the wavelength of the laser beam.

FIG. 5 illustrates the relation between the wavelength of laser beam and the light-absorption coefficient of silicon, and the relation between the wavelength of laser beam and the absorption depth. The light-absorption coefficient of the fundamental wave (wavelength of 1064 nm) is very small as compared with second harmonics with a wavelength of 532 nm, third harmonic with a wavelength of 355 nm, and fourth harmonics with a wavelength of 266 nm. If the fundamental wave is used, the irradiation energy density of about 5 times as high as that of the fourth harmonics is required because of the small light-absorption coefficient. Thus, the smaller the light-absorption coefficient, the higher the irradiation energy density required for machining.

If a laser beam having a wavelength of 1100 nm or more is used, the irradiation energy density has to be further increased because the light-absorption coefficient becomes much smaller. As a laser for generating a beam with a wavelength of 1100 nm or more, YLF laser with a wavelength of 1321 nm is known. If using this type of laser, energy density of about 30 J/cm$^2$ is needed for processing silicon. If such a high-energy beam is used to process silicon, heat generated by the irradiation cannot be sufficiently removed even if liquid is supplied to the target surface during the machining. There is high possibility of damage induced in the irradiation area and the surrounding. This fact leads to the conclusion that using a laser beam with a wavelength of 1100 mm or less is practical for processing a silicon wafer.

(2) Laser Beam Machining of Insulator on a Semiconductor Wafer

FIG. 6 illustrates an application of the laser beam machining approach of the first or second embodiment to formation of a trench 11T in an insulator and the lower silicon wafer 11. In the example shown in FIG. 6, fourth harmonics with a wavelength of 266 nm is used as the laser beam 2A, and pure water is used as the liquid 8 supplied to the target surface.

Figure 6A:
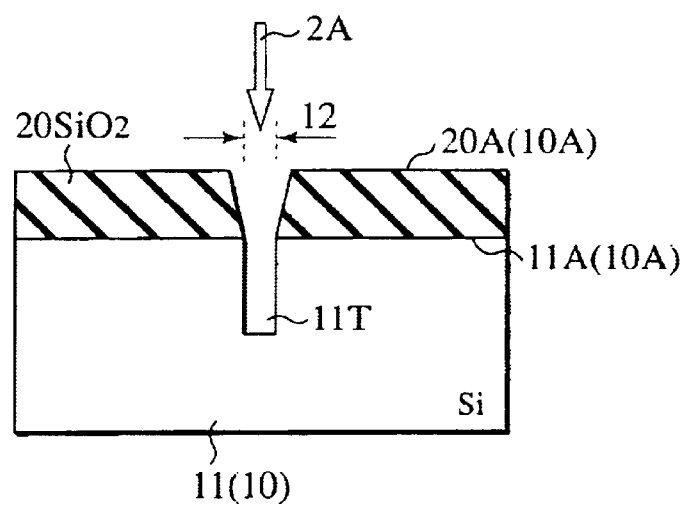
FIG. 6 illustrates an application of laser beam machining to a silicon wafer and insulator(s) formed on the silicon wafer under liquid supply according to the third embodiment of the invention.

In FIG. 6A, a silicon dioxide 20 is formed over a silicon wafer 11. The silicon dioxide 20 is used as, for example, an isolation dielectric for separating transistors or an interlevel dielectric. Pure water (not shown) is supplied to the target surface, that is, the top surfaces 20A of the silicon dioxide 20 and the exposed surface 11A of the silicon wafer 11, during the machining by the laser beam 2A. The laser beam 2A is guided to the target surfaces 20A and 11A through the pure water to form a trench 11T. Pure water is supplied to the target surface 20A and 11A in a constant direction in a substantially uniform flow to avoid turbulence.

Since, in the example shown in FIG. 6A, the silicon dioxide 20 does not absorb the 266 nm laser beam 2A, the laser beam 2A penetrates the silicon dioxide 20, and reaches the target surface 11A of the silicon wafer 11. Accordingly, trench 11T is formed directly in the silicon wafer 11. The silicon dioxide 20 deposed on the silicon wafer 11 is blown up during the machining of the trench 11T. Since pure water is supplied on the silicon dioxide 20 and the machined surface of 11A of the silicon wafer 11 during the machining, scattered particles of the silicon dioxide 20 and the silicon wafer 11 are washed away. Consequently, adhesion of the scattered particles or dust to the machined surface can be efficiently prevented.

Figure 6B:
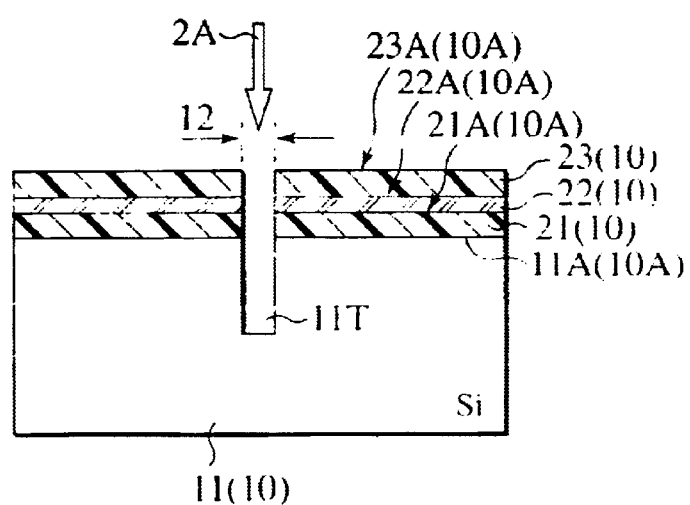

In FIG. 6B, a composite insulator formed on a silicon single crystal wafer 11 is laser-beam machined. An organic silicon dielectric 21, a silicon nitride film 22, and another organic silicon dielectric 23 are layered on the silicon wafer 11. During the irradiation of the laser beam 2A, pure water (not shown) is supplied to the target surfaces 23A, 22A, 21A, and 11A of the respective layers 23, 22 and 21 and the silicon wafer 11

Since, in the example shown in FIG. 6B, each of the organic silicon dielectrics 21 23, and the silicon nitride film 22 absorbs the 266 nm laser beam 2A, the laser beam 2A sequentially machines the organic silicon dielectric 23, the silicon nitride film 22, and the organic silicon dielectric 21 through the running pure water (not shown), and further machines the silicon wafer 11 to form a trench 11T without causing cracks or other defects.

Both examples shown in FIGS. 6A and 6B can be appropriately adapted to a dicing process for a semiconductor wafer.

In the example of FIG. 6B, the condition for laser-beam machining the multilevel (composite) dielectrics (i.e., the organic silicon dielectric 21, the silicon nitride film 22, and the organic silicon dielectric 23) without causing cracks is obtained by the following experiment.

First, samples, each of which has a single-layer dielectric selected from one of the organic silicon dielectrics 21, 23 and the silicon nitride film 22 on a silicon wafer 11, are prepared. The laser-beam absorption coefficient of the single-layer dielectric is $\alpha_i$ (nm$^{-1}$), and the thickness is $t_i$(nm). In order to prevent damage to the upper dielectric during irradiation of the target surface 11A of the silicon wafer 11, the energy density of the laser beam 2A must be set as equal to or smaller than 3 J/cm$_2$. On the other hand, in order to process both the dielectric and the underneath silicon wafer 11 using the laser beam 2A to form the trench 11T, the energy density of at least 4 J/cm$^2$ is needed. The energy density required to actually machine each of the organic silicon dielectrics 21 and 23 is 1 J/cm$^2$, while the energy density required to process the silicon nitride film 22 is 0.5 J/cm$^2$.

If the irradiation energy density required to form a trench 11T by laser beam machining is Ii (4 J/cm$^2$), and if the absorption coefficient and the thickness of each of the organic silicon dielectrics 21, 23 and the silicon nitride film 22 are $\alpha i$ and ti, then, the energy density Is of the laser beam 2A that reaches the target surface 11A of the silicon wafer 11 is expressed by equation (1).

$$Is=Ii*(1-R)exp(-\alpha i*ti) \qquad (1)$$

where R is the reflection coefficient.

As has been mentioned above, the irradiation energy density must be set as equal to or less than 3 J/cm$^2$ in order to process target surface 11A of the silicon wafer 11 without causing damage to the insulator on the silicon wafer 11. In equation (1), the reflection coefficient R of an insulator can be approximated to about 0. By inputting the conditions of Is>3 J/cm$^2$ and Ii=4 J/cm$^2$ into equation (1), the thickness $t_i$ of the dielectric on the silicon wafer 11 is determined by equation (2).

$$ti \geq 0.3(1/\alpha_i) \qquad (2)$$

If the absorption coefficient $\alpha_i$ and the thickness $t_i$ of each of the dielectrics satisfy equation (2), it becomes possible to process the target surface 11A of the silicon wafer 11 using the laser beam 2A without causing cracks in the upper dielectrics. Although, in the examples shown in FIGS. 6A and 6B, a silicon wafer is used as the substrate, the condition defined by equation (2) applies to any kind of semiconductor substrate, such as a silicon germanium (SiGe) substrate.

As has been explained above, since laser beam machining is carried out while supplying pure water to the target surface, the heat generated by the irradiation of the laser beam 2A is removed, and damage to the irradiation area 12 and its surroundings is greatly reduced.

In the examples shown in FIGS. 6A and 6B, pure water is supplied as the liquid 8 to the target surface. However, an aqueous ammonia solution may be used as the liquid 8. In such a case, the laser-beam machining rate with respect to the silicon wafer 11 is increased, as compared with using pure water.

By supplying the running liquid to the target surface, the air bubbles produced in the irradiation area 12 are continuously removed. This arrangement allows the laser beam 2A to continuously machine the target surface, and processing efficiency is improved.

If ultrasonic vibration is applied to the target surface, particles and dust produced during the laser beam machining are effectively prevented from adhering to the machined surface.

In the laser-beam machining of a wafer with a multilevel dielectric, a mechanical stress in each dielectric film can be efficiently reduced by selecting the absorption coefficient $\alpha_i$ and the thickness $t_i$ of each dielectric so as to satisfy $t_i \geq 0.3/\alpha_i$. Consequently, a fine pattern can be delineated in the wafer without causing cracks in the upper dielectrics, and production yield is improved.

(3) Laser Beam Machining of Metal Film on Semiconductor Wafer

FIG. 7 illustrates an example of laser-beam machining a metal film formed on a silicon single crystal wafer 11 via a silicon dioxide 20. In the example of FIG. 7, copper films 30 and 31 are used as the metal film. A liquid (not shown) is supplied to the target surfaces 30A and 31A in a uniform flow so as to avoid turbulence, and a laser beam 2A is guided to the target surfaces 30A and 31A, passing through the liquid. If necessary, ultrasonic vibration is applied to the target surfaces 30A and 31A. The copper film processed (or patterned) by the laser beam 2A is used as an electrode, interconnection for electrically connecting circuit elements, power-source lines for supplying source voltages, and the like.

Figure 7A:
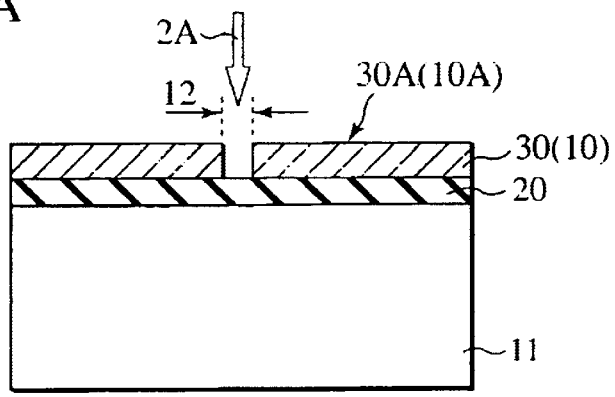
FIG. 7 illustrates an application of laser beam machining to a metal film formed on a silicon wafer via an insulation film under liquid supply according to the third embodiment of the invention.

In FIG. 7A, a pure thin copper film 30 having a thickness of 500 nm is processed using a laser beam 2A, while supplying pure water to the target surface 30A. A Q-switch Nd YAG laser is used. The profile of the laser beam 2A is 10 $\mu m \times 10 \mu m$, the irradiation energy density if 3 J/cm$^2$, and the number of shots is one (1).

Figure 1B:
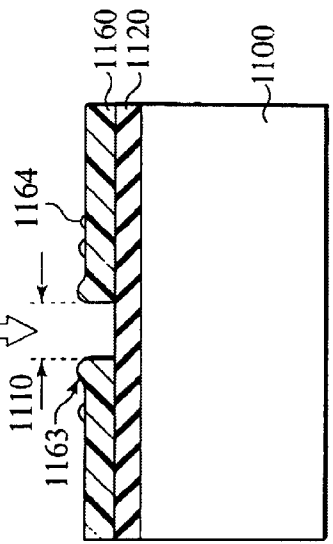

As the result of $\mu$-AES analysis, it was confirmed that the several tens of percent of carbon contamination 1135 (FIG. 1B), which was observed around the irradiation area 1110 after laser beam machining in ordinary atmosphere, did not occur around the irradiation area 12 of the thin copper film 30. Accordingly, there was no rise in the resistivity of the thin copper film 30 even near the irradiation area, and the processed thin copper film 30 can maintain the inherent resistivity of 1.8 $\mu\Omega$cm.

The TEM observation result shows that the swelling 1133 or the scattered metal grains 1134 (FIG. 1B), which were observed in conventional laser beam machining in ordinary atmosphere, were not detected.

By processing a thin copper film using a laser beam while supplying pure water to the target surface, undesirable phenomena, such as carbon contamination, swelling around the irradiation area, or adhesion of scattered particles, can be efficiently prevented. This effect can also be achieved even if the wavelength of the laser beam 2A is varied to 355 nm, 532 nm, and 1064 nm. Any types of laser beam 2A that can pass through pure water and that are absorbed in a metal may be appropriately used to process a thin metal film formed on a wafer.

Figure 7B:
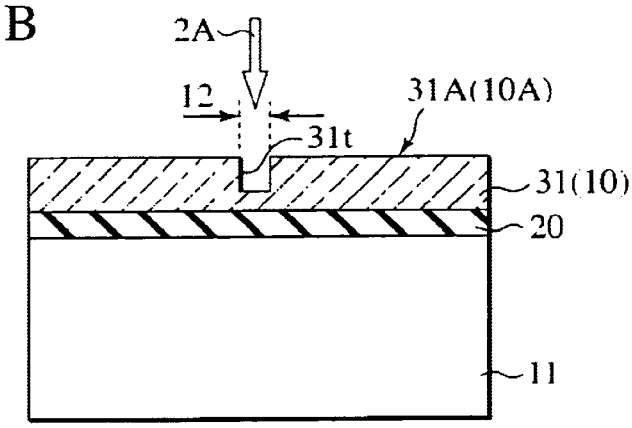

In FIG. 7B, a thick copper film 31 formed on a silicon single crystal wafer 11 and having a thickness of 1 $\mu$m is processed using a laser beam 2A. Pure water is supplied as the liquid 8 to the target surface 31A, and a Q-switch Nd YAG laser is used. The profile of the laser beam 2A is 10 $\mu m \times 10 \mu m$, the irradiation energy density if 3 J/cm$^2$, and the number of shots is one (1). Under the same conditions as in the example of FIG. 7A, the trench 31T formed in the thick copper film 31 cannot reach through to the silicon dioxide 20.

Figure 7C:
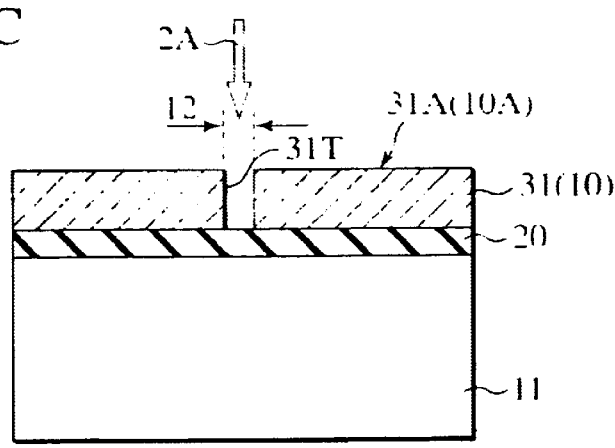

Then, as illustrated in FIG. 7C, glycine hydrogen peroxide solution (not shown) is introduced to the target surface 31A during the laser beam machining of the thick copper film 31 of a thickness of 1 $\mu$m. Since glycine hydrogen peroxide solution absorbs fourth harmonics with a wavelength of 266 nm and third harmonics with a wavelength of 355 nm, it is practical to use second harmonics with a wavelength of 532 nm or a fundamental wave with a wavelength of 1064 nm. The irradiation energy density of the laser beam 2A is again 3 J/cm$^2$, and the number of shots is one (1).

Glycine hydrogen peroxide solution does not advance etching at a room temperature, but if the temperature rises to about 100° C., then an etching effect of about several micrometers per minute is produced. If glycine hydrogen peroxide solution is supplied to the target surface during the laser beam machining of a copper film on a wafer, glycine hydrogen peroxide solution is heated by the irradiation energy of the laser beam 2A, and laser etching can be promoted without requiring an additional heater. Therefore, a trench 31T which reaches through the silicon dioxide 20 can be formed satisfactorily in the 1 $\mu$m-thick copper film 31. Consequently, the thick copper film 31 is completely patterned into the desired shape.

Again, $\mu$-AES analysis results show that no carbon contamination is detected around the irradiation area 12 even after the laser beam machining process with the supply of glycine hydrogen peroxide solution. Accordingly, there is no increase in the resistivity of the copper film 31 observed even near the irradiation area, and the appropriate resistivity value of 1.8 $\mu\Omega$cm is maintained.

Undesirable swelling and scattering of metal grains is not observed, and fine patterns with an accurate profile can be delineated in the copper film.

Although, in the examples shown in FIG. 7, copper films are used as an example of the metal film formed on a wafer, the same effect is achieved when laser-beam processing other types of metal layer. For example, a composite metal layer, which has a nickel or chromium film laminated on a copper film for the sake of anti-corrosion, a single metal layer made of aluminum or an aluminum alloy (Al-Si, Al-Cu, Al-Cu-Si, etc.), or a multi-layer having a barrier metal or an antireflection film on a single metal layer can be appropriately processed by a laser beam with liquid supplied to the target surface.

(4) Laser Beam Machining of Silicon Nitride and Photoresist

Figure 8A:
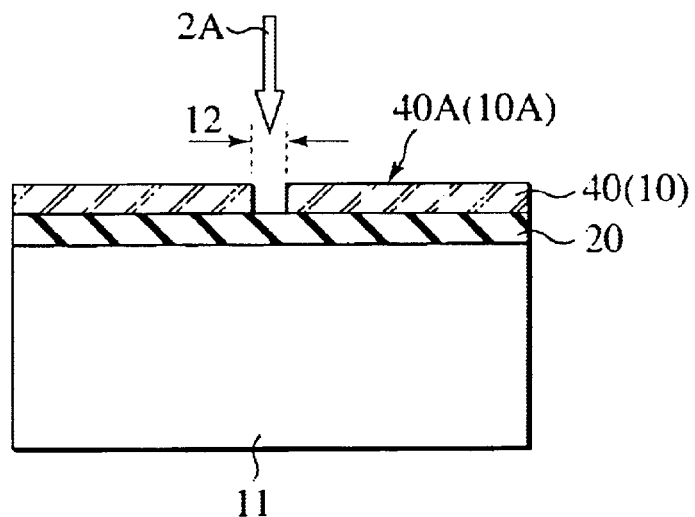
FIG. 8A shows laser beam machining of a silicon nitride film formed on a silicon wafer under liquid supply and FIG. 8B shows laser beam machining of a photoresist film formed on a silicon wafer under liquid supply.
Figure 8B:
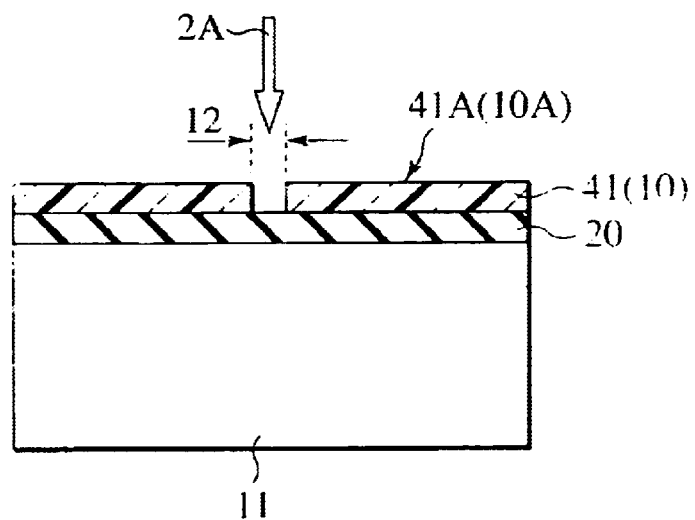

FIG. 8A illustrates an example of laser-beam machining of a silicon nitride film 40 formed on a silicon single crystal wafer 11 via a silicon dioxide 20, and FIG. 8B illustrates an example of laser-beam machining a photoresist 41 formed on a silicon single crystal wafer 11 via a silicon dioxide 20, while supplying a liquid (not shown) to the target surface.

The thermal diffusion coefficients of silicon nitride film or photoresist are one digit smaller than those of single crystal silicon and a metal layer. Accordingly, thermal influence on the area surrounding the laser irradiation area is comparatively small. In laser beam machining using a DUV ray (e.g., third or fourth harmonics of a Q-switch Nd YAG laser), the bond of an inorganic dielectric, such as the silicon nitridde film 40, and the bond of an organic material, such as the photoresist 41, can be cut directly. Therefore, it is expected that non-heat processing (ablation processing) with much less thermal influence can be performed.

In FIG. 8A, a 20 nm thickness silicon nitride film 40 is formed by CVD or sputtering on a wafer 11. Pure water is supplied to the silicon nitride film 40, and second harmonics with a wavelength of 266 nm is used as a laser beam 2A to process the silicon nitride film 40 under the running pure water. The profile of the laser beam 2A is 10 $\mu m \times 10 \mu m$, the irradiation energy density is 0.5 J/cm$^2$, and the number of shots is one (1).

Figure 1C:
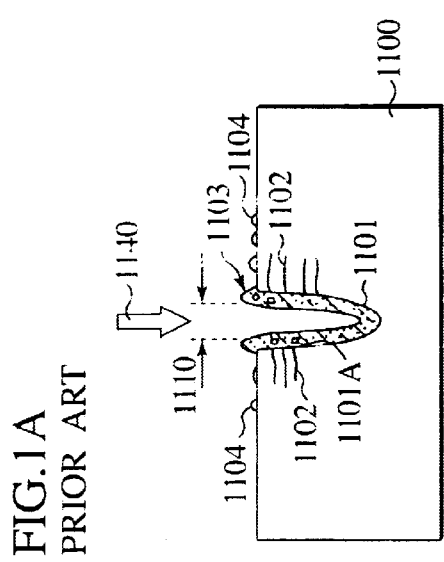

The SEM observation results show that undesirable swelling and scattered particles or grains of silicon nitride (FIG. 1C), as observed near the irradiation area after the conventional laser beam machining in ordinary atmosphere, have not occurred.

Since the silicon nitride film 40 does not absorb third harmonics with a wavelength of 355 nm, second harmonics with a wavelength of 532 nm, and the fundamental wave with a wavelength of 1064 nm, a laser beam having a wavelength other than these can be practically used. The silicon nitride film 40 processed by the laser beam is utilized as multilevel dielectric or a passivation film for protecting transistors or other elements.

In FIG. 8B, a resist is placed on the silicon dioxide 20 formed on the silicon wafer 11 by, for example, spin coating, and then, it is baked to form a photoresist film 41 with a thickness of 500 nm. Pure water (not shown) is supplied to the target surface 41A of the photoresist film 41, and a predetermined area of the photoresist film 41 is processed by a laser beam 2A, which is fourth harmonics with a wavelength of 266 nm of Q-switch Nd YAG laser, through the running pure water. The profile of the laser beam 2A is 10 $\mu m \times 10 \mu m$, the irradiation energy density is 0.5 J/cm$^2$, and the number of shots is one (1).

Figure 1D:
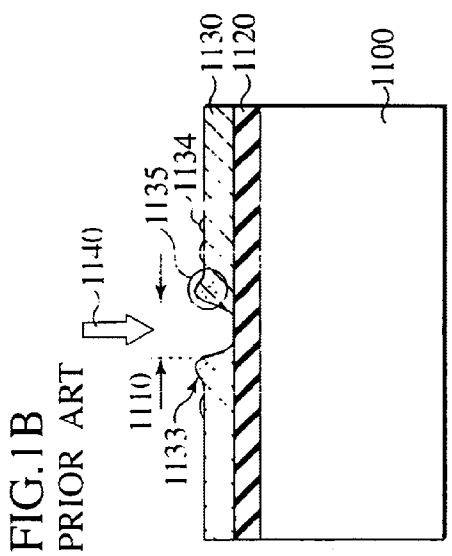

The SEM observation results show that undesirable swelling and scattered particles or grains of photoresist (FIG. 1D), which were observed after the conventional laser beam machining in ordinary atmosphere, are not produced. The processed photoresist film 41 is used as an etching mask for patterning circuit elements, interconnections, electrode, or the like.

In either of the examples of FIG. 8A or 8B, ultrasonic vibration may be applied to the target surface during the laser beam machining. In such a case, dust and particles produced scattered by the laser beam can be effectively prevented from adhering to the machined surface.

(5) Laser Beam Machining Applied to the Formation of Dicing Lines

Apart from the first dicing technique explained in connection with FIG. 4, there is a dicing technique for polishing and thinning a silicon wafer first and then dicing the thin wafer into chips. Laser beam machining through a running liquid can also be applied in such a dicing technique, as illustrated in FIG. 9.

Figure 9A:
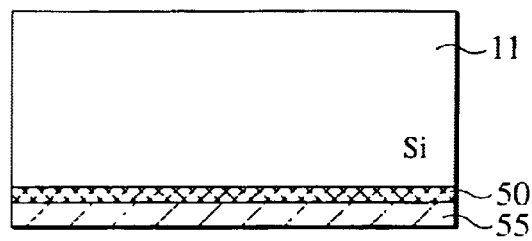
FIG. 9 illustrates an application of laser beam machining to dicing a silicon wafer that has been thinned in advance.
Figure 9B:
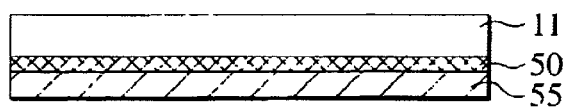

First, as shown in FIG. 9A, the device surface 50 of the silicon wafer 11 is held on a dicing tape 55. Then, as shown in FIG. 9B, the silicon wafer 11 is polished on its rear face, which is opposite to the device surface 50, in order to thin the wafer 11. In general, a crushed layer is produced in the thinned wafer 11 due to mechanical stress, which causes the strength of the wafer 11 to be reduced. Accordingly, such a crushed layer is removed by wet or dry etching to prevent the chip strength from decreasing.

Figure 9C:
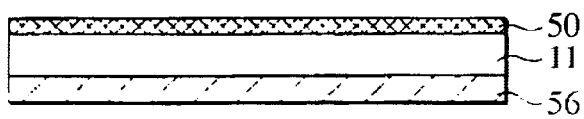

Then, as shown in FIG. 9C, the dicing tape 55 is removed form the device surface 50, and the wafer 11 is turned upside down so that the rear face of the wafer 11 is held on a dicing tape 56.

Figure 9D:
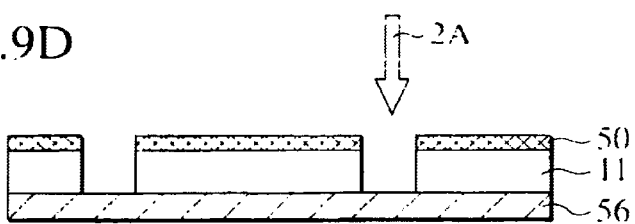

Finally, as shown in FIG. 9D, the wafer 11 is processed from the device surface 50 using a laser beam 2A, while supplying a liquid (not shown) to the device surface 50, to cut the wafer 11 into chips. If necessary, ultrasonic vibration is applied to the device surface during laser beam machining for the purpose of removing dust and air bubbles from the device surface 50 more efficiently.

With a blade dicing technique, the side edges of a chip are damaged, and consequently, the chip strength is reduced. In addition, in those regions in which the thickness is 50 $\mu$m or less, the chip is likely to break or crack during the blade dicing, and production yield falls. However, by carrying out laser beam machining using the apparatus shown in FIG. 2 or 3, dicing lines can be formed in a wafer even in regions thinner than 50 $\mu$m, without causing the chip to break or crack. Damage to the side edges of the chip, such as voids, dislocation and swelling, can also be prevented, and the reliability of the chip is thereby improved.

FIG. 10 illustrates examples of optimization of the chip arrangement on the wafer 60, which are realized by laser-beam machining dicing lines through a running liquid. The conventional blade dicing is limited to forming cross stripes as illustrated in FIG. 10A. In contrast, laser beam machining through a running liquid allows an arbitrary pattern of dicing lines to be formed on the wafer 60. For example, as shown in FIG. 10B, zigzag dicing lines are formed on the wafer 60 to optimize the chip arrangement, and the number of chips obtained from a wafer can be increased. Hexagonal chips may be separated from the wafer 60, as illustrated in FIG. 10C. This arrangement allows the maximum number of chips to be produced from a single wafer.

Figure 11:
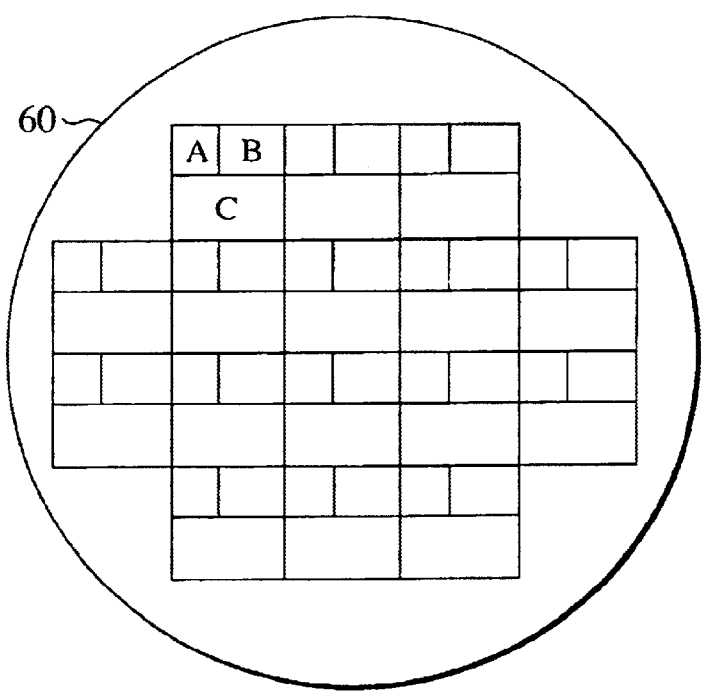
FIG. 11 illustrates an example of dicing pattern to produce different sizes and shapes of chips from a wafer by using laser beam machining.

In addition, as illustrated in FIG. 11, chips A, B, and C having different sizes and shapes can be formed in a single wafer 60. This dicing method is effective when producing only several hundreds of chips.

(6) Laser Beam Machining Applied to the Formation of Global Routing

FIG. 12 illustrates an application of laser beam machining to the formation of single-level global routing, and FIG. 13 illustrates an application of laser beam machining to the formation of multilevel global routing, both carried out under the supply of a liquid.

Global routing generally extends across the circuit blocks on an upper level of a chip, and supplies a global clock to each block. Since global routing is a long interconnection, routing delay must be reduced as much as possible, and therefore, it becomes important to reduce the resistance of the interconnection. For this reason, laser beam machining through a running liquid, which can effectively prevent contamination and the adhesion of dust or scattered particles, is put to good use in forming global routing.

Figure 12A:
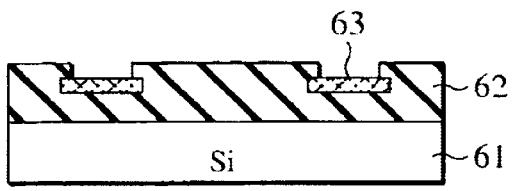
FIG. 12 illustrates an application of laser beam machining under liquid supply to formation of single-level global interconnection.
Figure 12B:
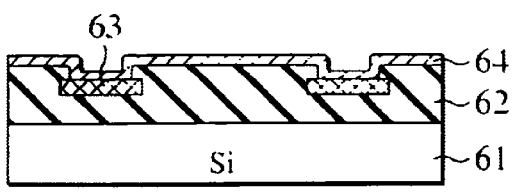
Figure 12C:
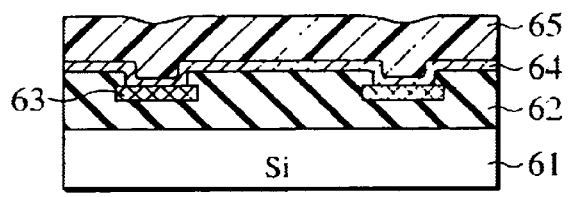
Figure 12D:
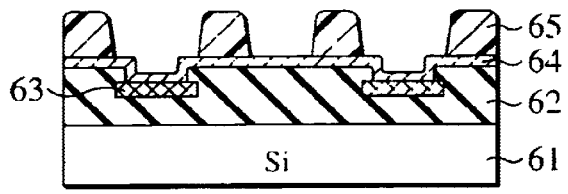

To form single-level global routing, a substrate, in which pads 63 are formed on a silicon wafer 61 via an insulating film 62, is prepared, as shown in FIG. 12A. Then, a thin metal film 64, such as Cu/Ta/Tan or Pd/Ti/Ni, is formed over the insulating film 62 and the pads 63, as illustrated in FIG. 12B. Then, a resin insulator 65 is formed on the thin metal film 64, as illustrated in FIG. 12C. Then, the resin insulator 65 is patterned by laser beam machining, while supplying a liquid (not shown) to the processed surface of the resin insulator 65, as illustrated in FIG. 12D. During the laser beam machining, ultrasonic vibration may be applied to the surface being processed (i.e., the target surface).

Figure 12E:
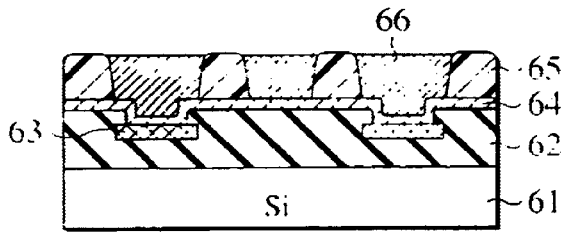
Figure 12F:
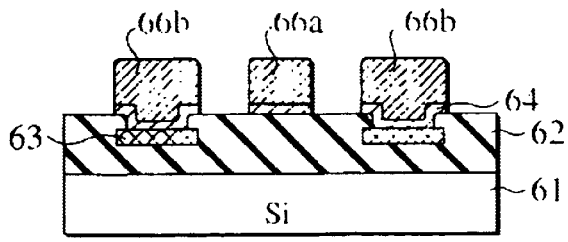

Then, as illustrated in FIG. 12E, a plating layer 66 is formed by filling the patterns formed in the resin insulator 65 with Cu, Au, or solder with electrolytic plating. Finally, as illustrated in FIG. 12F, the resin insulator 65 is removed using an organic solvent, and the lower thin metal film 64 is also removed by etching using an acidic etchant, such as acetic acid, hydrochloric acid, nitric acid, or diluted hydrofluoric acid. Thus, global routing and metal bumps are formed.

Using this approach, global routing is accurately formed in a substrate without using a photolithography process, which requires an expensive exposure mask and CMP.

In a conventional method, a resin film, such as a photosensitive polyimide, is patterned by photolithography. This conventional method requires a developing step and the drainage of liquid waste, which adversely affects the environment. In addition, in the photolithography process, a photosensitive resin insulator must be used as a resit, and therefore, freedom in selecting the resist material is very limited. In other words, an inexpensive and low-permitivity material, such as a teflon group resin material, cannot be used in the photolithography process. On the contrary, laser beam machining through a running liquid can process almost all Kinds or resin materials, and the resultant pattern is more accurate without damage or the adhesion of dust.

FIG. 13 illustrates the manufacturing process of multilevel global routing using laser beam machining through a running liquid. First, as shown in FIG. 13A, a substrate, in which lower interconnections 73 are formed on a silicon wafer 71 via an insulating film 72, is prepared. Then, a first resin insulator 75 is formed over the insulating film 72 and the lower interconnections 73, as shown in FIG. 13B. Then, VIA holes that reach the lower interconnection 73 are formed in the first resin insulator 75 by laser beam machining with the supply of liquid (not shown), as shown in FIG. 13C. In this state, the lower interconnection 73 are exposed.

Figure 13A:
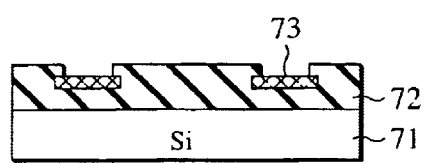
FIG. 13 illustrates an application of laser beam machining under liquid supply to formation of multi-level global interconnection.
Figure 13B:
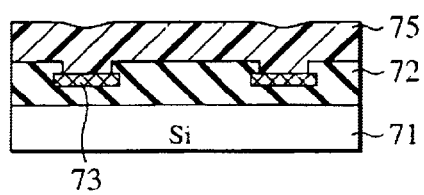
Figure 13C:
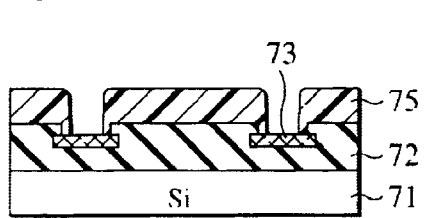
Figure 13D:
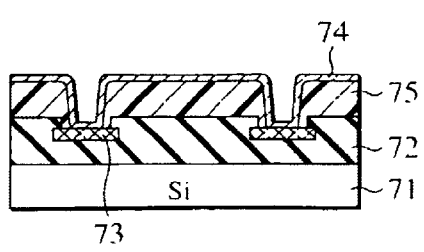
Figure 13E:
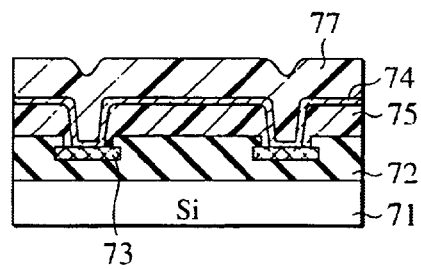

Then, as shown in FIG. 13D, a thin metal film 74, such as Cu/Ta/Tan or Pd/Ti/Ni, is formed on the first resin insulator 75 and the lower interconnection 73. Then, as shown in FIG.

Figure 13F:
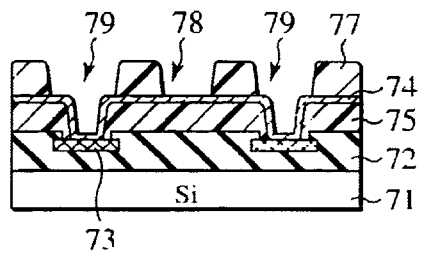

13E, a second resin insulator 77 is formed on the thin metal film 74, which fills the VIA holes formed in the previous step. The second resin insulator 77 is then patterned by laser-beam machining through a running liquid (not shown), and trenches 78 and 79 that reach the thin metal film 74 are formed, as shown in FIG. 13F.

Figure 13G:
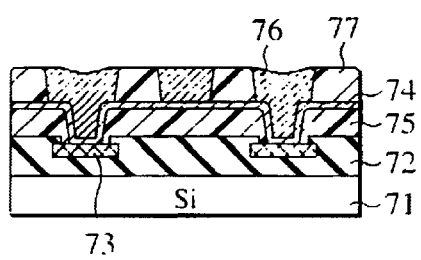
Figure 13H:
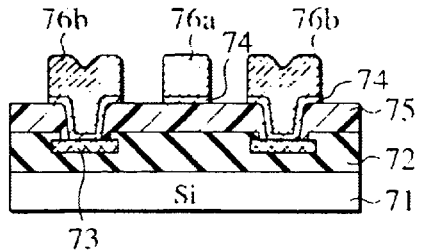

Then, the trenches 78 and 79 are filled with a metal 76, such as Au or Cu, produced by electrolytic plating, as shown in FIG. 13G. Finally, the second resin insulator 77 is removed using an organic solvent, and the corresponding portion of the thin metal film 74 underneath is etched with an acidic solution, as shown in FIG. 13H. In this manner, multilevel routing 76b and interconnections 76a are formed in an accurate and reliable manner, without using the high-cost photolithography process.

The processes shown in FIGS. 12 and 13 are applicable to forming solder bumps, Au bumps or global routings on the device surface of a semiconductor apparatus, or to forming interconnections on a printed circuit board.

(7) Laser Beam Machining for Selective Removal of Antireflection Film on Alignment Marks As the patterns formed in semiconductor devices become increasingly precise, an improved technique for aligning patterns at a higher accuracy while observing alignment marks has become indispensable. Such alignment marks are formed on the lower layer in a photolithography process.

Exposure in a semiconductor lithography process is carried out using an ultraviolet laser, such as a KrF excimer laser or an ArF excimer laser. To conduct fine patterning using a beam of a ultraviolet range, an antireflection film is inserted under the resist layer for the purpose of eliminating optical influence from the lower layers. Because antireflection film absorbs ultraviolet beams and blocks penetration to the lower layers, an additional optical system, other than the optical exposure system, using a visible light becomes necessary for the observation of the mark.

However, since the optical observation axis is independent of the optical exposure axis, the distance between the two optical axes varies in response to small changes in environmental factors, such as temperature changes. This fluctuation causes alignment accuracy to be reduced.

In order to improve alignment accuracy, it is desirable to use only an optical exposure system for carrying out both exposure and observation of the alignment marks. However, because of the existence of the antireflection film under the resist, the resist and the antireflection film must be removed to reveal the alignment marks prior to the observation.

Carrying out laser beam machining in ordinary atmosphere to selectively remove the resist and the antireflection films is undesirable because dust and particles are scattered, as has been described above. Adhesion of the dust or the particles onto the resist causes patterning errors in the resist, which results in reduced yield.

Therefore, laser beam machining with the supply of a liquid is appropriately applied in revealing the alignment mark, while applying ultrasonic vibration to the target surface if necessary. This approach allows a portion of the antireflection film and the resist located above the alignment mark to be removed to reveal the alignment mark without the adhesion of dust and particles.

Figure 14A:
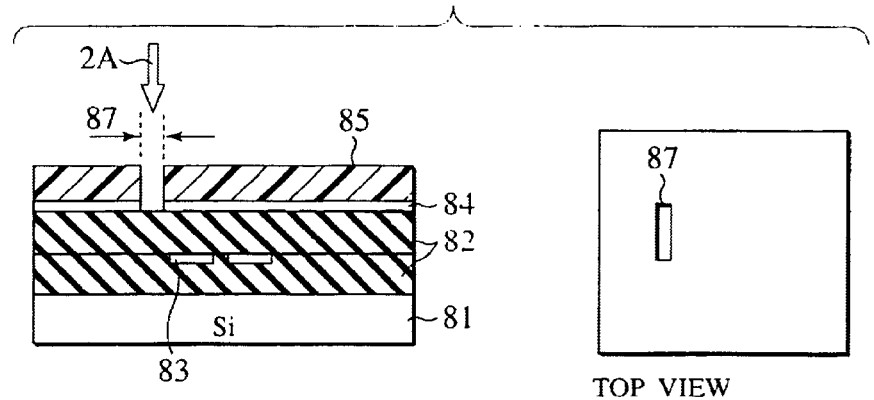
FIG. 14 illustrates an application of laser beam machining, in which a narrow laser beam is scanned on the resist film formed on anantireflection film to remove a predetermined area of the resist film.
Figure 14B:
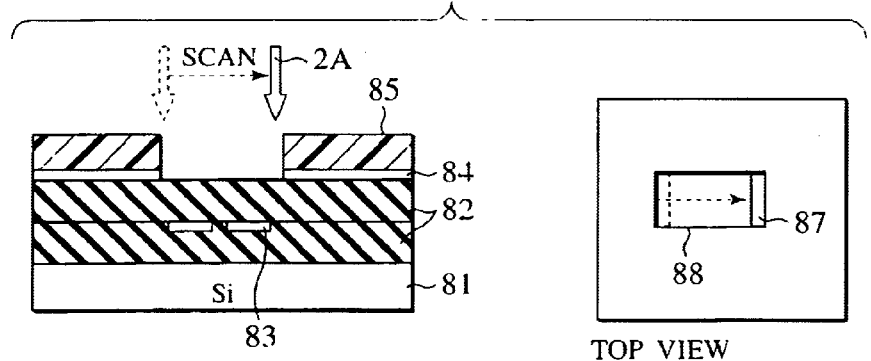

Especially, if the laser beam 2A is narrowed and scanned on the target surface of the resist 85, while supplying a liquid (not shown) to the target surfaces, a predetermined area of the resist 85 and the antireflection film 84 can be precisely removed, as illustrated in FIGS. 14A and 14B. Accordingly, the alignment marks 83 formed in the insulating film 82 on the silicon wafer 81 can be observed by the optical exposure system.

In the example shown in FIG. 14A, the beam profile 87 is narrowed to $10 \mu m \times 80 \mu m$, and the laser beam 2A is scanned along the area 88 shown in FIG. 14B. Alternatively, the laser beam 2A may be fixed, and instead, the stage (not shown) may be moved in the opposite direction.

Figure 14C:
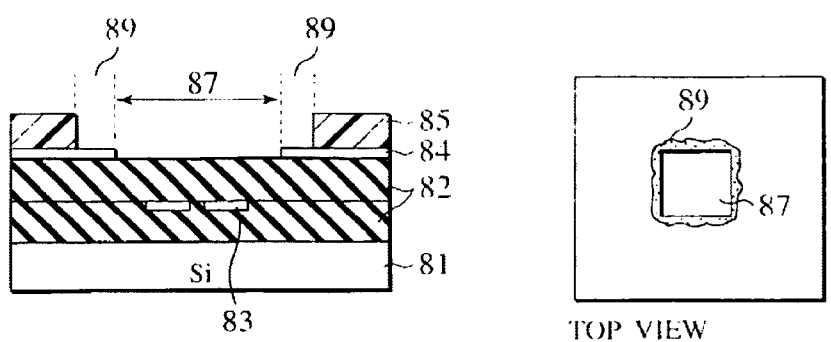

If the resist 85 and the antireflection film 84 are removed by one-shot laser beam machining, as illustrated in FIG. 14C, the resist 85 may peel off from the interface between the resist 85 and the antireflection film 84, depending on the type and thickness of the resist 85 or on the adhesiveness between the resist 85 and the antireflection film 84. Such a peel-off area 89 spreads around the irradiation area 87. This phenomenon occurs because the antireflection film 84 absorbs the heat of the laser beam 2A and melts and evaporates. Evaporation of the antireflection film 84 causes stress at the interface between the resist 85 and the antireflection film 84, thereby blowing off the resist 85 in the upper layer. The peeling also appears conspicuously in a multilevel composite resist consisting of a photoresist film, an inorganic film, and an antireflection film.

The alignment mark 83 generally has a side ranging from $50 \mu m$ to $200 \mu m$. If the beam profile 87 is set to $160 \mu m \times 80 \mu m$, and if the resist 85 and the antireflection film 84 are processed by one shot, the peel-off area 89 is generated around the irradiation area 87, as shown in FIG. 14C.

Narrowing the beam profile and scanning the narrow beam in a predetermined area with the supply of a liquid can effectively prevent the peel-off phenomenon, as well as the adhesion of dust and particles.

FIG. 15 illustrates examples of the beam profile used in laser beam machining. FIG. 15A shows an example of using a set of slits 87 to produce multiple beam strips 87. In this case, the irradiation position of the laser beam 2A is shifted at a predetermined length so that the entire process area is exposed. Preferably, the width of the beam strip 87 corresponds to the interval of the beam strips 87. During the irradiation and the beam shift, a liquid is supplied to the target surface with a substantially uniform flow. Ultrasonic vibration may be applied to the target surface, if necessary.

FIG. 15B shows an example of using a mosaic beam. In this case, the laser beam 2A is shifted in the first direction, for example, rightward on the page, and then, shifted again in the second direction, for example, downward in the page, in order to irradiate the entire process area.

In either example, the beam profile is sufficiently narrowed, and therefore, the resist 85 is protected from peeling off. Of course, if it is not likely to cause the resist to peel off, laser beam 2A having the profile coincident with the process area may be used to carry out one-shot laser-beam machining. In addition, the antireflection film 84 may be processed before the resist 85 is formed. In this case, a portion of the antireflection film 84 located above the alignment marks 83 is selectively removed by laser beam machining with the supply of a liquid, and then, the resist 85 is formed. The alignment marks 83 are observed through the resist 85 and the insulating film 82 by the optical exposure system.

(8) Laser Beam Machining of Chip-on-Chip Semiconductor Device

Figure 16:
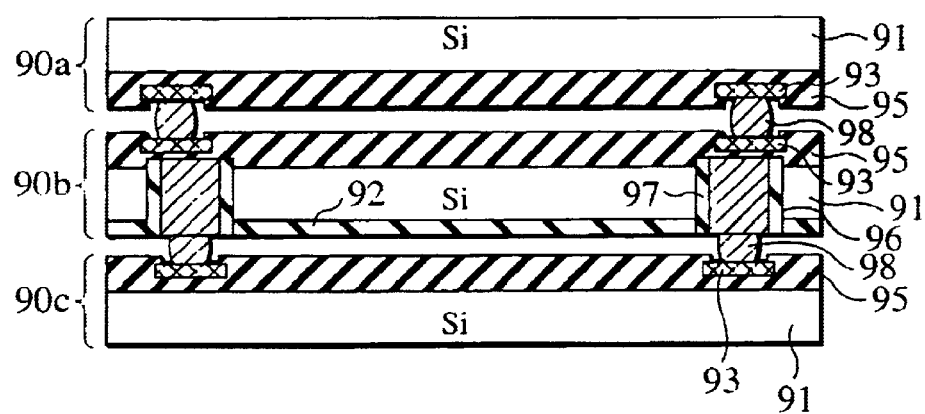
FIG. 16 illustrates a chip-on-chip type semiconductor device manufactured utilizing laser beam machining under liquid supply.
Figure 17A:
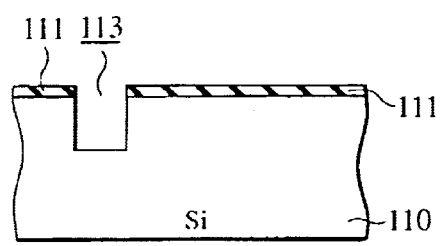
FIG. 17 illustrates an application of laser beam machining to formation of through-holes in the chip-on-chip type semiconductor device.
Figure 17E:
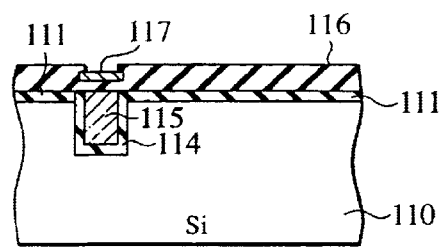
Figure 17B:
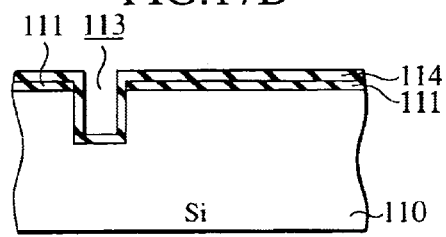
Figure 17F:
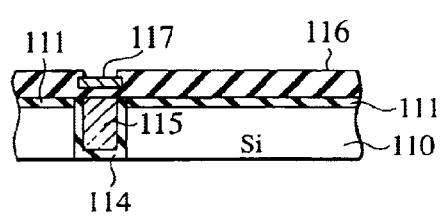
Figure 17C:
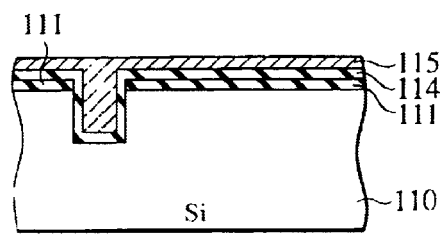
Figure 17G:
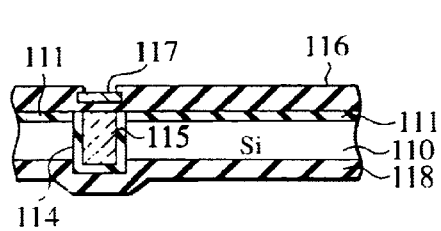
Figure 17D:
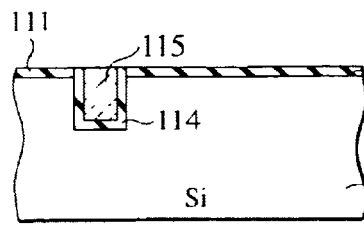
Figure 17H:
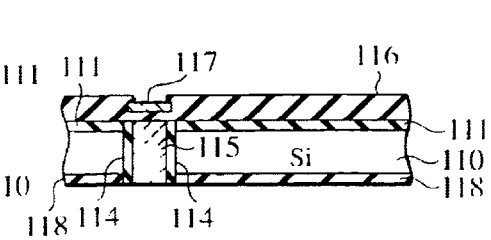

FIG. 16 illustrates an application of laser beam machining with the supply of a liquid in fabricating a chip-on-chip semiconductor device.

In recent years, a chip-on-chip technique has attracted a great deal of attention. In a chip-on-chip semiconductor device, multiple chips are stacked and connected to each other via the through holes formed in the chips. The through-holes are filled with, for example, copper, and function as metal interconnections. As illustrated in FIG. 16, a chip-on-chip semiconductor device includes the first and third chips 90a and 90c, and the second chip 90b positioned between them. The first and third chips 90a and 90c have pads 93 and metal bumps 98 placed on the pads 93. The second chip 90b has interconnection plugs 96, which is formed by filling the through-holes with a metal via the insulating film 97. Each chip has a multilevel interconnection 95, and the second chip 90b has an insulating film 92 on the rear face of the semiconductor substrate 91. By connecting the stacked chips, the length of the interconnection can be greatly reduced, and interconnect delay can be reduced.

Currently, the process for forming the through-hole is carried out by RIE. However, the processing rate is relatively low, and its productivity is inferior. On the other hand, when laser beam machining is conducted in ordinary atmosphere to form the through-hole, the silicon device is damaged by laser irradiation, and the circuit elements located near the through-holes become defective.

Therefore, laser beam machining with the supply of a liquid without turbulence is applied to forming the through-holes in the substrate. Ultrasonic vibration may be applied to the target surface of the substrate, if necessary. The liquid supplied to the target surface may be drained, or alternatively, it may be circulated. In the latter case, a filter is provided to remove the washed dust and particles. By carrying out laser beam machining with the supply of a liquid, the through-hole is precisely formed without damage or the adhesion of dust and particles. Laser beam machining through running liquid can also reduce the processing time, and at the same time, the reliability of the device can be improved.

FIG. 17 illustrates a process of forming a through-hole in a chip stacked in the chip-on-chip semiconductor device. First, as shown in FIG. 17A, silicon wafer 110 and the silicon dioxide 111 formed on the silicon wafer 110 are processed by a laser beam (not shown), while supplying a liquid (not shown) to the target surfaces of the silicon dioxide 111 and the silicon wafer 110, to form a hole 113. Then, as shown in FIG. 17B, silicon dioxide 114 is formed in the hole 113 and over the silicon dioxide 111. The subsequent steps shown in FIGS. 17C through 17H are the same as those in the conventional method. That is, the hole 113 is filled with a metal and the surface of the metal layer 115 is planarized (FIG. 17C). The surface metal layer 115 and the silicon dioxide 114 are removed to form the through-plug 115 (FIG. 17D). A multilevel interconnection layer 116, which comprises interconnections and dielectric, is formed over the through-plug 115 and the silicon dioxide 111, and a portion of the uppermost interconnection in the multilevel interconnection layer 116 is selectively exposed to form a pad 117 (FIG. 17E). Then, the silicon substrate 110 is thinned by, for example, polishing (FIG. 17F), and a silicon dioxide 118 is formed on the rear face of the silicon substrate 110 (FIG. 17G). Finally, the silicon dioxide 118 is planarized, and the through-plug 115 is exposed to form a contact surface with the bump of another chip.

By directly processing the target surface of the chip using a laser beam with the supply of a liquid, the process time is greatly reduced. In addition, a through-hole of an excellent profile can be achieved, without damage to the silicon wafer or adhesion of dust or particles to the irradiated area. These advantages produce the reliability in the resultant product. If ultrasonic vibration is applied to the target surface during the laser beam machining, the adhesion of particles or air bubbles can be prevented more efficiently.

(Fourth Embodiment)

Figure 18:
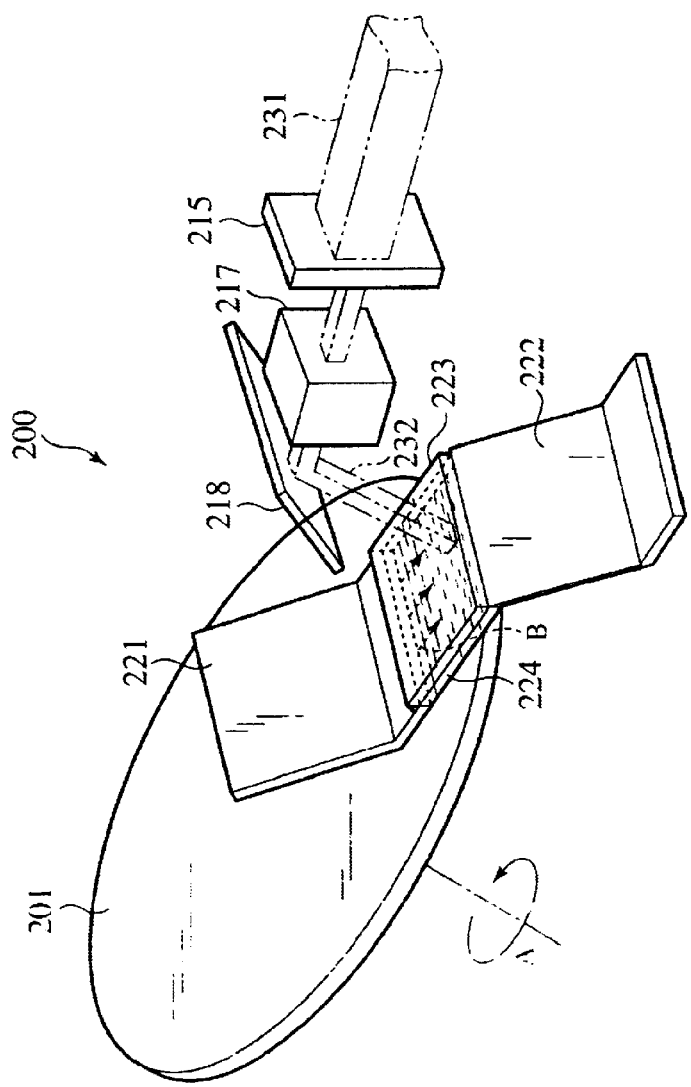
FIG. 18 schematically illustrates the structure of a laser beam machining apparatus according to the fourth embodiment of the invention.
Figure 19:
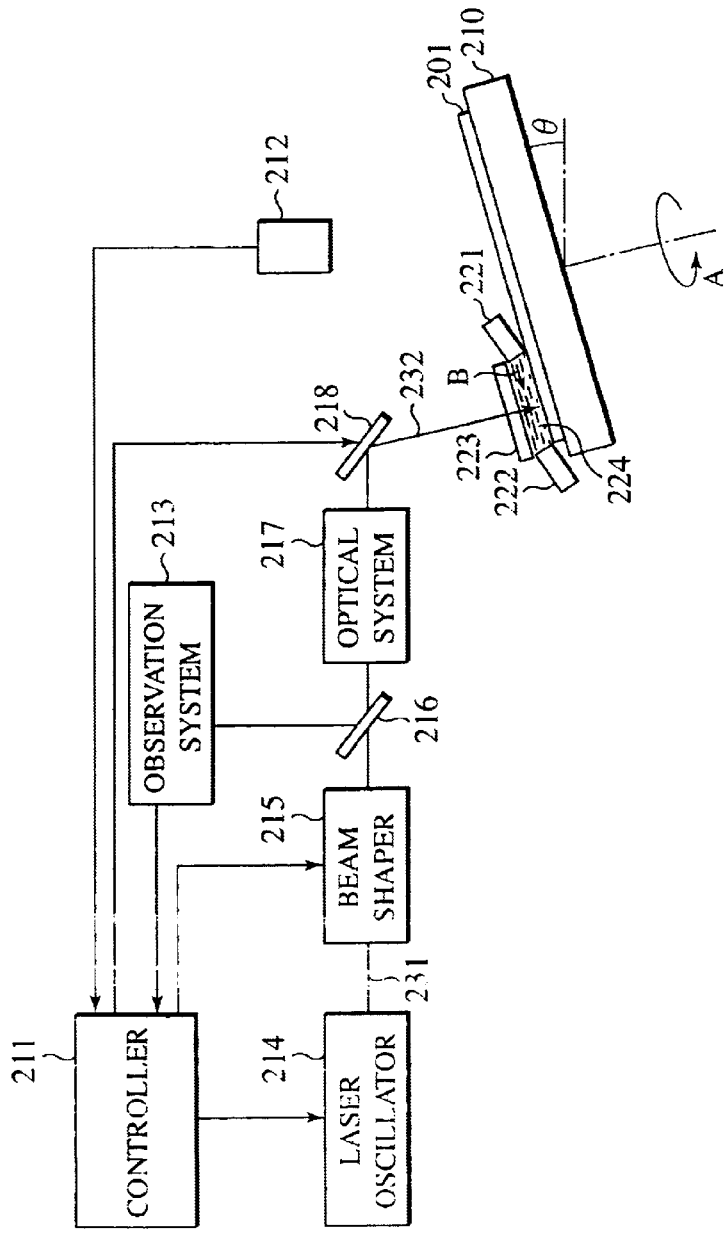
FIG. 19 is a block diagram showing the control system and the optical system used in the laser beam machining apparatus shown in FIG. 18.

FIGS. 18 and 19 schematically illustrate a laser beam machining apparatus 200 according to the fourth embodiment of the invention. The laser beam machining apparatus 200 is suitably used for processing the periphery of a wafer.

In general, a wafer is transported between several places during the manufacturing process of a semiconductor device. For example, a wafer is accommodated in a wafer cassette, and transferred to a processing chamber. If the wafer is entirely covered with various layers, such as photoresist films or dielectrics, the peripheries of the layers laminated on the wafer interfere with the cassette, and dust is produced. To avoid this dust, only the circumferential portion of the layers is removed by wet etching in a conventional technique. To be more precise, an etchant is injected from the nozzle toward the periphery of a semiconductor wafer, while rotating the wafer at a high rate, thereby selectively removing the photoresist films and dielectrics.

However, it is difficult for the wet etching to precisely control the selective removal of fine areas. In addition, a large amount of chemical solution is used, which adversely affects the environment.

The laser beam machining apparatus 200 shown in FIGS. 18 and 19 can solve these problems, and is capable of selectively removing fine and minute areas near the periphery of the wafer, without causing dust, by the irradiation of a laser beam with a supply of liquid to the processed area on the wafer.

The laser beam machining apparatus 200 includes a laser oscillator 214 for outputting a laser beam 231, an X-Y-θ stage 210 for holding a wafer 201, a rotation mechanism (not shown) for rotating the wafer 201, an optical system (217, 218) for guiding the laser beam onto the wafer 201, and a mechanism for supplying and collecting a liquid 224 to and from the irradiation area on the wafer 201. The liquid 224 is, for example, pure water, thinner, developer, etc.

The mechanism for supplying and collecting the liquid 224 comprises a supply nozzle 221 movable on the wafer 201, and a collection nozzle 222 for receiving the liquid 224 from the wafer 201. The mechanism may have a transparent cover 223, if necessary, in order to make the liquid surface even and prevent the laser beam 232 from scattering.

The injection port of the supply nozzle 221 is located in substantial alignment with the target surface of the wafer 201, as illustrated in FIG. 19, thereby feeding the liquid 224 to the irradiation area on the wafer 201 in a constant direction in a substantially uniform flow. The supply nozzle 221 may be furnished with an ultrasonic vibrator (not shown) including a piezoelectric device, for example. In this case, ultrasonic vibration is applied to the target surface of the wafer 201 through the liquid 224.

The X-Y-θ stage 210 translates the wafer 201 in X and Y directions and tilts the wafer 201 at an angle θ (FIG. 19). The ultrasonic vibrator may be provided to the rear face of the X-Y-θ stage 210. In this case, ultrasonic vibration propagates to the target surface of the wafer 201 through the stage 210 and the wafer 201.

The laser beam machining apparatus 200 also has a variable slit 215, which functions as a beam shaper for shaping the laser beam 231 into a desired profile, and a half-mirror 216. The laser beam 231, which has passed through the variable slit 215 and the half-mirror 216, is projected as a reduced image by the optical projection system 217, and is guided to a prescribed position on the wafer 201 by the mirror 218.

The laser oscillator 214 is, for example, a Q switch YAG laser, and it can choose any of the wavelengths of a fundamental wave (wavelength of 1064 nm), second harmonics (wavelength of 532 nm), third harmonic (wavelength of 355 nm), or fourth harmonics (wavelength of 266 nm). A KrF excimer laser may be used at an appropriate wavelength (for example, 248 nm).

The laser beam machining apparatus 200 further includes a controller 211, an optical observation system 213 for monitoring the irradiation position of the beam, and an alignment scope 212 for controlling the irradiation position on the wafer 201.

The controller 211 controls the ON/OFF timing and the intensity of the laser oscillator 214, the motion of the beam shaper (i.e., the variable slit) 215, the angle of the mirror 218, etc, based on the outputs from the observation system 213 and the alignment scope 212.

The beam shaper 215 is comprised of a variable slit, which regulates the dimensions of the profile of the laser beam 231 in the X and Y directions, independently. The half-mirror 216 allows the shaped laser beam to pass through in the forward path, and reflects the return beam that has been reflected from the wafer 201 toward the observation system 213.

The observation system 213 includes, for example, a photodetector, which detects the intensity of the laser beam reflected by the half-mirror 216. The detection result is output to the controller 211. The observation system 213 may have a CCD camera, which observes the irradiation area on the wafer 201 directly and outputs the observation result to the controller 211. The controller 211 controls the laser oscillator 214 based on the given information so that the desired intensity is obtained. The controller 211 also controls the slit size of the beam shaper 215 so as to obtain the desired beam profile, and controls the angle of the mirror 218 so as to guide the laser beam 232 to a prescribed position on the wafer 201.

The alignment scope 212 includes, for example, a CCD camera, which takes in the irradiation area on the wafer 201 as image information and outputs the image data to the controller 211. Based on the image data, the controller 211 adjusts the angle of the mirror 218 so that the laser beam 232 is incident to the prescribed position on the wafer 201 at a high precision.

When processing the periphery of the wafer 201 using the laser beam machining apparatus 200, the supply nozzle 221 is placed to a prescribed position in the wafer 201 so that the injection port is substantially aligned with the target surface of the wafer 201. A liquid 224 is supplied form the nozzle 221 to the target surface near the periphery of the wafer 201. A laser beam 232 is guided to a predetermined position on the wafer 201, passing through the liquid 224 (and the transparent board 223, if necessary), to process the peripheral portion of the laminated layers on the wafer 201, while rotating the wafer 201, as indicated by the arrow in FIG. 18, at a high revolution rate.

Since the liquid 224 is supplied from the nozzle 221 to the peripheral area of the wafer 201 during laser beam machining, undesirable air bubbles and dust produced by the laser irradiation are washed away.

Ultrasonic vibration may be applied to the target surface, if necessary, during laser beam machining. This arrangement can efficiently prevent the dust produced by the laser beam machining from adhering to the periphery of the wafer 201. Air bubbles, which cause the laser beam to fluctuate, can also be shaken off, and therefore, processing efficiency is improved.

FIG. 20 illustrates an example of laser-beam machining the peripheral area 203 of the layer 202 on the wafer 201.

The laser 202 is a photoresist, a polyimide film, or a coating dielectric, which includes, for example, an organic silicon dielectric containing a methyl group, and an SOG (Spin on Glass) film.

The wafer 201 is placed on the X-Y-θ stage 210, and the angle of the mirror 218 is adjusted so that the laser beam 232 will be guided to the circumference of the wafer 201.

Then, pure water 224, to which ultrasonic vibration has been applied, is supplied to the target surface of the resist 202 from the nozzle 221. The laser beam 232 is generated form the laser oscillator 214, and is guided to a prescribed position on the layer 202, while the wafer 201 is rotated in the arrow A (FIG. 18) at a high revolution rate. The laser oscillator 214 continuously oscillates to emit laser pulses. The energy density of the laser beam per pulse is 0.1 J/cm$^2$ to 0.5 J/cm$^2$, which can be appropriately adjusted in accordance with the thickness of the resist 202. The wavelength of the laser beam 232 is 266 nm or 355 nm. However, other wavelengths may be selected according to the thickness and the structure of the lower layer. The processing position is controlled in the order of 10 $\mu$m.

FIG. 20B illustrates the processed wafer 201, from which a portion of the resist 202 (that is, the peripheral area 203 of the resist 202) is removed by laser beam machining. By removing the peripheral area of the resist (or other laminated layer) 202 from the wafer 201, interference between the wafer cassette and the laminated layers on the wafer 201 can be avoided during the transportation of the wafer 201. Consequently, generation of dust can be prevented, and projection yield is improved.

Unlike conventional wet etching, laser beam machining with the supply of a liquid can realize selective removal of the layer at a high precision of 10 $\mu$m order without variation in the thickness of the layer. Using wet etching, the width of the processed area reaches several millimeters from the periphery of the wafer, and the thickness of the layer varies near the processed area.

Although, in the fourth embodiment, pure water is used to conduct the laser beam machining with the supply of a liquid, other liquids may be used in accordance with the material of the target layer. For example, if removing a photosensitive layer made of a photoresist or a photosensitivei polyimide, a developer may be supplied to the target surface from the nozzle 221 during laser beam machining. In this case, the energy density per pulse is set to the range from 0.01 J/cm$^2$ to 0.1 J/cm$^2$. By using a developer, it becomes possible to process the photosensitive layer at the energy density of one digit smaller than that required using pure water.

The controllability of the selective removal of the photosensitive layer using a developer is several micrometers, which is much more precise than using pure water.

FIG. 21 illustrates an example of revealing the manufacture's serial number 205 using the laser beam machining apparatus 200. A thin metal film 204 containing Cu, Al, Ru, W, Ta, Ti, etc. is formed on the wafer 201, and the manufacture's serial number 205 is hidden under the metal film 204, as shown in FiG. 21B.

Then, the wafer 201 is placed on the X-Y-θ stage 210, and where pure water 224 is supplied to the surface of the wafer 201. A laser beam 231 emitted from the laser oscillator 211 is shaped by the beam shaper 215, and guided to a prescribed position on the metal film 204 by the mirror 218, while the wafer 201 is being rotated on the stage 210.

The beam shaper 215 can adjust the beam profile. For example, when processing the metal film 204 along the periphery of the wafer 201, the profile of the laser beam 232 is set small. On the other hand, when revealing the manufacture's serial number, the beam profile is set larger. Alternatively, the beam profile may be kept constant, and instead, the angle of the mirror 218 may be adjusted. That is, so that only a portion of the laser beam 232 strikes the periphery of the wafer 201 when processing the periphery of the wafer 201, while the whole profile of the laser beam 232 is guided to the target surface when revealing the manufacture's serial number. The wavelength of the laser beam 232 is 266 nm or 355 nm, and the energy density per pulse is 1 $J/cm^2$ to 3 $J/cm^2$.

FIG. 21C shows the processed wafer 201. Since controllability of laser beam machining with the supply of a liquid is in the order of several micrometers to 10 micrometers, the peripheral area 206 of the metal layer 204 can be selectively removed at a desired width. At the same time, using the same laser beam machining apparatus 200, the manufacturer's serial number 205 is exposed at a high controllability by selectively removing the corresponding area 207 of the metal layer 204.

In the example of FIG. 21, pure water is supplied to the target surface of the metal layer 204. However, if the metal layer 204 contains Cu as the principal component, glycine hydrogen peroxide solution can be used. As has been described above, glycine hydrogen peroxide solution has a characteristic such that it does not interact with a metal film at a room temperature, but at an certain temperature, an etching effect is produced, and the etching rate increases along with the temperature rise. Consequently, if using a glysine hydrogen peroxide solution, the metal film can be removed efficiently at a lower energy density by making use of a natural temperature rise due to the irradiation of the laser beam. Even if the energy density of the laser beam is lowered to 0.5 $J/cm^2$ to 1.0 $J/cm^2$ per pulse, the same processing rate as that using pure water can be achieved. In addition, the process controllability with respect to a metal film is higher than that using pure water.

Glycine hydrogen peroxide solution absorbs the laser beam with wavelengths of 266 nm and 355 nm. Accordingly, if using this agent, it is desirable to use a laser beam of another wavelength, for example, a wavelength of 532 nm or 1064 nm.

As has been explained above, by applying laser beam machining with the supply of a liquid to the manufacturing process of semiconductor devices, the adhesion of air bubbles and dust to the processing surface can be efficiently prevented, while processing the target surface at a high controllability and high precision. Although the application of laser beam machining has been explained using various examples using a silicon wafer, the invention can be equally applicable to processing any semiconductor substrate, such as III–V compound semiconductor substrates. Such applications are not limited to the manufacture of semiconductor devices, but include the processing of a quartz glass substrate used in a liquid crystal display, a resin substrate (e.g., an epoxy resin substrate, the polyimide resin substrate, etc.) used in a printed circuit board, a ceramic substrate, a carbonization silicon substrate, and other types of substrates. Laser beam machining with the supply of a liquid is also suitably applied to fabricating printed circuit boards, such as a motherboard, a daughter board, a baby board, a CPU board, and a memory board, and fabricating surface-mount substrate, to which one or more bear chips are mounted.

Moreover, laser beam machining with the supply of a liquid is applicable not only to manufacture of electronic components, such as semiconductor devices or wiring substrates, but also to the processing of components of precision instruments.

What is claimed is:

1. A laser beam machining method comprising:
supplying a liquid, through which a laser beam can be transmitted, to a target surface of an object to be processed from an inlet port located so as to substantially align with the target surface;
flowing the liquid through the target surface to an outlet port located so as to substantially align with the target surface;
guiding a laser beam to the target surface through the liquid; and
processing the target surface by the laser beam under the application of ultrasonic vibration, wherein the liquid is supplied to the target surface in a constant direction in a substantially uniform flow.

2. The method of claim 1, wherein the ultrasonic vibration is applied to the target surface through the liquid.

3. The method of claim 1, wherein the ultrasonic vibration is applied to the target surface through the object.

4. The method of claim 2, wherein the object is a semiconductor wafer, and the target surface of the semiconductor wafer is machined by the laser beam to form a dicing groove in the semiconductor wafer.

5. The method of claim 4, wherein the liquid is supplied to the target surface in a parallel direction to a surface of the semiconductor wafer.

6. A laser beam machining method comprising:
supplying a liquid, through which a laser beam can be transmitted, to a target surface of an object to be processed from an inlet port located so as to substantially align with the target surface;
flowing the liquid through the target surface to an outlet port located so an to substantially align with the target surface;
guiding a laser beam to the target surface through the liquid; and
processing the target surface by the laser beam, wherein the liquid is supplied to the target surface in a constant direction in a substantially uniform flow.

7. A laser beam machining method comprising;
supplying a liquid, through which a laser beam can be transmitted, to a target surface of an object to be processed from an inlet port located so as to substantially align with the target surface;
flowing the liquid through the target surface to an outlet port located so as to substantially align with the target surface;
guiding a laser beam to the target surface through the liquid; and processing the target surface by the laser beam, wherein the object is a semiconductor wafer, and the target surface of the semiconductor wafer is machined by the laser beam to form a dicing groove in the semiconductor wafer.

8. The method of claim 7, wherein the liquid is supplied to the target surface in a parallel direction to a surface of the semiconductor wafer.

9. A laser beam machining method comprising;
supplying a liquid stream, through which a laser beam can be transmitted, to a target of a semiconductor wafer to be processed, in a parallel direction to a surface of the semiconductor wafer;
guiding a laser beam to the target through the liquid; and
processing the target by the laser beam, wherein the liquid is supplied to the target in a constant direction in a substantially uniform flow.

10. A laser beam machining method comprising:

supplying a liquid stream, through which a laser beam can be transmitted, to a target of a semiconductor wafer to be processed, in a parallel direction to a surface of the semiconductor wafer;

guiding a laser beam to the target through the liquid; and processing the target by the laser beam, wherein the target is a film fanned on the surface of the semiconductor wafer.

11. The method of claim 10, wherein the film is patterned into a predetermined shape.

12. The method of claim 11, wherein the film is a metal film, and the metal film is patterned into a wiring shape.

13. The method of claim 11, wherein the film is a resin insulator, and the resin insulator is patterned into a prescribed shape to form a trench, the method further comprising;

filling the trench in the resin insulator with a metal to form a global routing.

14. The method of claim 10, further comprising:

rotating the wafer so as to remove the film selectively along a periphery of the wafer.

15. The method of claim 10, wherein the condition of $Ti \geqq 0.3/\alpha i$ is satisfied, where $\alpha i$ is a laser-absorption coefficient of the film, and Ti is a thickness of the film.

16. A laser beam machining method comprising:

supplying a liquid stream, through which a laser beam can be transmitted, to a target of a semiconductor wafer to be processed, in a parallel direction to a surface of the semiconductor wafer;

guiding a laser beam to the target through the liquid; and processing the target by the laser beam, wherein the target is a resist film formed on the surface of the semiconductor wafer via an antireflection film and a predetermined area of the resist film and the antireflection film is removed by scanning the laser beam.

* * * * *

UNITED STATES PATENT AND TRADEMARK OFFICE
CERTIFICATE OF CORRECTION

PATENT NO. : 6,720,522 B2
DATED : April 13, 2004
INVENTOR(S) : Ikegami et al.

It is certified that error appears in the above-identified patent and that said Letters Patent is hereby corrected as shown below:

Column 24,
Line 21, change "claim 2" to -- claim 1 --.

Column 25,
Line 8, change "fanned" to -- formed --.

Signed and Sealed this

Thirtieth Day of November, 2004

JON W. DUDAS
*Director of the United States Patent and Trademark Office*